(12) United States Patent
Zhang et al.

(10) Patent No.: US 11,737,367 B2
(45) Date of Patent: Aug. 22, 2023

(54) PIEZOELECTRIC DEVICE AND METHOD FOR MANUFACTURING THE SAME, AND DISPLAY APPARATUS

(71) Applicant: BOE TECHNOLOGY GROUP CO., LTD., Beijing (CN)

(72) Inventors: Feng Zhang, Beijing (CN); Wenqu Liu, Beijing (CN); Zhijun Lv, Beijing (CN); Liwen Dong, Beijing (CN); Xiaoxin Song, Beijing (CN); Zhao Cui, Beijing (CN); Detian Meng, Beijing (CN); Libo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 325 days.

(21) Appl. No.: 17/039,228

(22) Filed: Sep. 30, 2020

(65) Prior Publication Data
US 2021/0167274 A1  Jun. 3, 2021

(30) Foreign Application Priority Data

Nov. 29, 2019 (CN) .......................... 201911207749.2

(51) Int. Cl.
*H01L 41/113* (2006.01)
*H10N 30/30* (2023.01)
*H10N 30/082* (2023.01)
*H10N 30/87* (2023.01)

(52) U.S. Cl.
CPC ......... *H10N 30/302* (2023.02); *H10N 30/082* (2023.02); *H10N 30/877* (2023.02)

(58) Field of Classification Search
CPC .......................... H01L 41/1132; H01I 41/077
See application file for complete search history.

(56) References Cited

U.S. PATENT DOCUMENTS

| | | | |
|---|---|---|---|
| 2015/0305201 A1* | 10/2015 | Ho ..................... | H01L 23/3677 361/709 |
| 2019/0196298 A1* | 6/2019 | Noh .......................... | G02F 1/33 |
| 2021/0305487 A1* | 9/2021 | Li ................... | H10N 30/10516 |

FOREIGN PATENT DOCUMENTS

| | | |
|---|---|---|
| CN | 105006459 A | 10/2015 |
| CN | 110265544 A | 9/2019 |

OTHER PUBLICATIONS

China National Intellectual Property Administration. Notification of the First Office Action dated Jun. 29, 2022. Chinese Patent Application No. 201911207749.2 Name of Applicant(s): Boe Technology Group Co., Ltd. Chinese Language. 7 pages.

(Continued)

*Primary Examiner* — Bryan P Gordon
(74) *Attorney, Agent, or Firm* — Procopio, Cory, Hargreaves & Savitch LLP

(57) ABSTRACT

A piezoelectric device includes: a base having at least one hole, a heat conductive portion disposed in the at least one hole and in contact with a wall of the at least one hole, and at least one piezoelectric sensor disposed on the base. A thermal conductivity of the heat conductive portion is greater than a thermal conductivity of the base. Each piezoelectric sensor includes: a first electrode, a piezoelectric pattern made of a piezoelectric material and a second electrode that are sequentially stacked in a thickness direction of the base.

18 Claims, 23 Drawing Sheets

(56) References Cited

OTHER PUBLICATIONS

China National Intellectual Property Administration. Notification of the First Office Action dated Jun. 29, 2022. Chinese Patent Application No. 201911207749.2 Name of Applicant(s): Boe Technology Group Co., Ltd. English Language Translation. 8 pages.

* cited by examiner

PIEZOELECTRIC DEVICE AND METHOD FOR MANUFACTURING THE SAME, AND DISPLAY APPARATUS

CROSS-REFERENCE TO RELATED APPLICATION

This application claims priority to Chinese Patent Application No. 201911207749.2, filed on Nov. 29, 2019, which is incorporated herein by reference in its entirety.

TECHNICAL FIELD

The present disclosure relates to the field of sensing technologies, and in particular, to a piezoelectric device and a method for manufacturing the same, and a display apparatus.

BACKGROUND

Ultrasonic waves are a type of mechanical waves having advantages of high frequency, short wavelength, good directivity, directional propagation and high penetration rate. Ultrasonic sensors are sensors that convert ultrasonic signals into other energy signals (typically electrical signals).

Sensing materials in the ultrasonic sensors mainly are piezoelectric materials or nickel-iron-aluminum alloy materials. The piezoelectric materials includes piezoelectric crystals, piezoelectric ceramics, and a piezoelectric high polymer material. Ultrasonic sensors whose sensing materials are mainly made of the piezoelectric materials, i.e., piezoelectric sensors, are reversible sensors that are capable of converting electrical signals into mechanical oscillations to generate ultrasonic signals, and are also capable of converting received ultrasonic signals into electrical signals. Therefore, the ultrasonic sensors include transmitting sensors, receiving sensors, and transmitting-receiving ultrasonic sensors.

SUMMARY

In first aspect, a piezoelectric device is provided. The piezoelectric device includes a base having at least one hole, a heat conductive portion disposed in the at least one hole and in contact with a wall of the at least one hole, and at least one piezoelectric sensor disposed on the base. A thermal conductivity of the heat conductive portion is greater than a thermal conductivity of the base. Each piezoelectric sensor includes a first electrode, a piezoelectric pattern made of a piezoelectric material and a second electrode that are sequentially stacked in a thickness direction of the base.

In some embodiments, a depth of the at least one hole is less than a thickness of the base in the thickness direction of the base.

In some embodiments, the base further has a first surface and a second surface that are opposite to each other in the thickness direction of the base. The at least one hole is disposed in the first surface, and the at least one piezoelectric sensor is disposed on the second surface.

In some embodiments, a thickness of the heat conductive portion is equal to a depth of the at least one hole in the thickness direction of the base.

In some embodiments, the thermal conductivity of the heat conductive portion is in a range from approximately 120 W/mK to approximately 450 W/mK.

In some embodiments, the at least one hole includes a plurality of holes spaced apart from each other.

In some embodiments, an orthographic projection of one piezoelectric sensor on the base does not overlap with any hole. In some other embodiments, the orthographic projection of one piezoelectric sensor on the base overlaps with at least one of the plurality of holes.

In some embodiments, the heat conductive portion includes a plurality of heat conductive blocks spaced apart from each other, and each heat conductive block is disposed in a respective one of the plurality of holes.

In some embodiments, the piezoelectric device further includes at least one connecting electrode. The at least one piezoelectric sensor includes a plurality of piezoelectric sensors spaced apart from each other, and second electrodes in all piezoelectric sensors are electrically connected by the at least one connecting electrode.

In some embodiments, a size of the at least one piezoelectric pattern is in an order of micrometers or nanometers.

In second aspect, a display apparatus is provided. The display apparatus includes a display panel, and the piezoelectric device according to the above embodiments, disposed on a side of the display panel.

In some embodiments, the display panel includes a plurality of sub-pixels. An orthographic projection of one piezoelectric sensor in the piezoelectric device on the display panel has an overlapping region with M sub-pixels in the plurality of sub-pixels, M being an integer greater than zero and less than four.

In some embodiments, an orthographic projection of a first electrode of the piezoelectric sensor on the display panel completely overlaps with one of the M sub-pixels. An orthographic projection of a piezoelectric pattern of the piezoelectric sensor on the display panel has an overlapping region with the M sub-pixels.

In third aspect, a method for manufacturing the piezoelectric device according to the above embodiments. The method includes: forming the base having the at least one hole; forming the heat conductive portion in the at least one hole; wherein the heat conductive portion is in contact with the wall of the at least one hole, and the thermal conductivity of the heat conductive portion is greater than the thermal conductivity of the base; and forming the at least one piezoelectric sensor on the base. Each piezoelectric sensor includes the first electrode, the piezoelectric pattern made of the piezoelectric material and the second electrode that are sequentially formed on the base.

In some embodiments, the base further has a first surface and a second surface that are opposite to each other in the thickness direction of the base. Forming the base having the at least one hole, includes: forming the at least one hole in the first surface by a dry etching process, a wet etching process, or a laser drilling process. Forming the at least one piezoelectric sensor on the base, includes: forming the at least one piezoelectric sensor on the second surface.

In some embodiments, forming the heat conductive portion in the at least one hole, includes: forming the heat conductive portion in the at least one hole by an evaporation process or an electroplating process.

In some embodiments, forming the at least one piezoelectric sensor on the base, includes: forming at least one first electrode on the base; forming a piezoelectric film on the at least one first electrode; forming at least one protective pattern made of a conductive material on the piezoelectric film; wherein an area of an orthographic projection of each protective pattern on the base is less than an area of an orthographic projection of the piezoelectric film on the base; removing a portion of the piezoelectric film that is not covered by the at least one protective pattern by an etching process to form at least one piezoelectric pattern; and forming a conductive film on the at least one protective pattern. Each protective pattern and a portion of the conductive film that is in contact with the protective pattern forming a second electrode.

In some other embodiments, forming the at least one piezoelectric sensor on the base, includes: forming at least one first electrode on the base; forming a piezoelectric film on the at least one first electrode; forming at least one second electrode on the piezoelectric film; wherein an area of an orthographic projection of each second electrode on the base is less than an area of an orthographic projection of the piezoelectric film on the base; and removing a portion of the piezoelectric film that is not covered by the at least one second electrode by an etching process to form at least one piezoelectric pattern.

In yet some other embodiments, forming the at least one piezoelectric sensor on the base, includes: forming at least one first electrode on the base; forming a piezoelectric film on the at least one first electrode; forming at least one third photoresist pattern on the piezoelectric film; wherein an area of an orthographic projection of each third photoresist pattern on the base is less than an area of an orthographic projection of the piezoelectric film on the base; removing a portion of the piezoelectric film that is not covered by the at least one third photoresist pattern by an etching process to form at least one piezoelectric pattern; removing the at least one third photoresist pattern; and forming a second electrode on each piezoelectric pattern.

In some embodiments, forming the at least one protective pattern on the piezoelectric film, includes: forming a first conductive layer on the piezoelectric film; forming a photoresist layer on the first conductive layer; patterning the photoresist layer to form at least one first photoresist pattern; wherein an area of an orthographic projection of each first photoresist pattern on the base is less than an area of an orthographic projection of the piezoelectric film on the base; and etching a region in the first conductive layer that is not covered by the at least one first photoresist pattern to form the at least one protective pattern.

In some other embodiments, forming the at least one second electrode on the piezoelectric film, includes: forming a second conductive layer on the piezoelectric film; forming a photoresist layer on the second conductive layer; wherein an area of an orthographic projection of each second photoresist pattern on the base is less than an area of an orthographic projection of the piezoelectric film on the base; patterning the photoresist layer to form at least one second photoresist pattern; and etching a region in the second conductive layer that is not covered by the at least one second photoresist pattern to form the at least one second electrode.

In fourth aspect, a method for manufacturing a piezoelectric device is provided. The method includes: forming at least one hole in a first surface of a base, a depth of the at least one hole being less than a thickness of the base; forming a heat conductive portion in the at least one hole; wherein the heat conductive portion is in contact with a wall of the at least one hole, and a thermal conductivity of the heat conductive portion is greater than a thermal conductivity of the base; forming at least one piezoelectric sensor on a second surface of the base opposite to the first surface; wherein each piezoelectric sensor includes a first electrode, a piezoelectric pattern made of a piezoelectric material and a second electrode that are sequentially formed on the base; and thinning the base to remove the at least one hole and the heat conductive portion therein.

In fifth aspect, a piezoelectric device is provided, obtained by using the method according to the above embodiments.

BRIEF DESCRIPTION OF THE DRAWINGS

In order to describe technical solutions in the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art can obtain other drawings according to these drawings. In addition, accompanying drawings in the following description may be regarded as schematic diagrams, and are not limitations on actual sizes of products, an actual process of a method and so on that the embodiments of the present disclosure relate to.

DETAILED DESCRIPTION

Figure 1A:
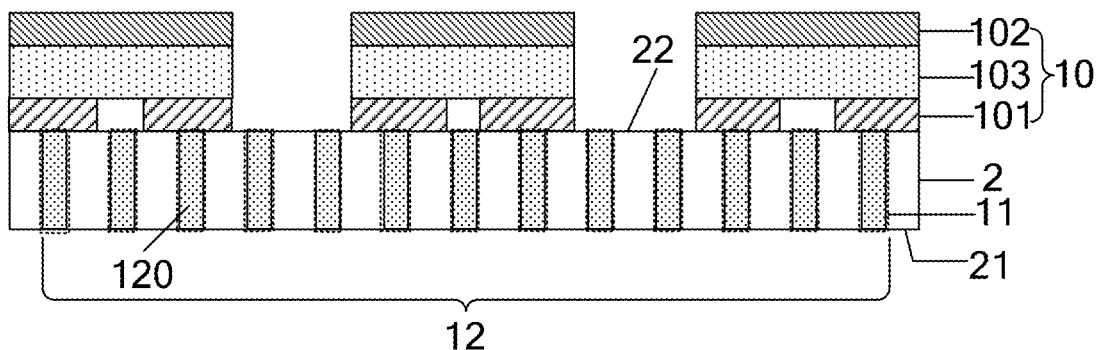
FIG. 1A is a schematic diagram of a piezoelectric device, in accordance with some embodiments.

Technical solutions in embodiments of the present disclosure will be described clearly and completely in combination with accompanying drawings in the embodiments of the present disclosure. However, the described embodiments are merely some but not all embodiments of the present disclosure. All other embodiments obtained on a basis of the embodiments of the present disclosure by a person of ordinary skill in the art without paying any creative effort shall be included in the protection scope of the present disclosure.

Unless the context requires otherwise, the term "comprise" and other forms thereof such as the third-person singular form "comprises" and the present participle form "comprising" in the description and the claims are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or the example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

In addition, the terms such as "first" and "second" are used for descriptive purposes only and are not to be construed as indicating or implying the relative importance or implicitly indicating the number of indicated technical features below. Thus, features defined as "first" and "second" may explicitly or implicitly include one or more of the features. As used in the Description and the claims, the singular forms "a", "an", and "the" include plural referents unless the content clearly dictates otherwise. In the description of the embodiments of the present disclosure, the term "a/the plurality of" means two or more unless otherwise specified.

It will be understood that when a layer or element is referred to as being "on" another layer or substrate, it may be directly on the another layer or substrate, or one or more intervening layers or elements may also be present. Further, it will also be understood that when a layer or element is referred to as being "under" another layer or substrate, it may be directly under the layer or substrate, and one or more intervening layers or elements may also be present. Similarly, it will also be understood that when a layer or element is referred to as being "between" two layers or elements, it may be the only layer or element between the two layers or elements, or one or more intervening layers may also be present.

Some embodiments may be described using the expression "coupled" and "connected" along with their derivatives. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled" or "communicatively coupled", however, may also mean that two or more elements are not in direct contact with each other, but yet still co-operate or interact with each other. The embodiments disclosed herein are not necessarily limited in this context.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In this Description, the term "thickness" means an average value of the thickness of each part of a layer or element, or means a general, overall thickness of the layer or element.

In addition, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10% or ±5% of the stated value.

In recent years, with the development of intelligent electronic products and increasing requirements of users for security and privacy of the electronic products, a biometric identification technology has developed rapidly, which is particularly represented by a fingerprint identification technology and facial identification technology.

An ultrasonic technology is widely used due to its advantages of good stability and high accuracy. Taking the fingerprint identification as an example, when a fingerprint is collected by using the ultrasonic technology, the collected fingerprint may be not affected by dirt (e.g., sweat, hand cream or gel) on a surface of the finger.

In a case where the ultrasonic technology is applied to the fingerprint identification, ultrasonic signals are generated by mechanical oscillation of a piezoelectric material in a piezoelectric sensor. After the ultrasonic signals are reflected by the finger, the piezoelectric sensor is capable of receiving the reflected ultrasonic signals, and converting the received ultrasonic signals into electrical signals to identify the fingerprint information.

Of course, the ultrasonic technology may be applied not only to the fingerprint identification technology and the facial identification technology, but also to technologies such as a tactile feedback technology, a medical measurement, a mechanical measurement. Therefore, the ultrasonic technology has become a current research hotspot.

Some embodiments of the present disclosure provide a piezoelectric device capable of generating ultrasonic signals and receiving reflected ultrasonic signals.

As shown in any one of FIGS. 1A to 2C, the piezoelectric device 1 includes a base 2, a heat conductive portion 12, and at least one piezoelectric sensor 10.

The base 2 is generally in a shape of a plate, and FIGS. 1A to 2C are sectional structural diagrams of the piezoelectric device 1 along a thickness direction of the base 2. The base 2 may be a rigid base or a flexible base. The rigid base is, for example, a glass base with a thermal conductivity of approximately 1.1 W/mK (Watts per meter Kelvin). The flexible base is, for example, a polyimide (PI) base with a thermal conductivity of approximately 0.15 W/mK.

The base 2 is provided with at least one hole 11. For example, the base 2 provided with the at least one hole 11 may be obtained by etching a substrate.

The heat conductive portion 12 is disposed in the at least one hole 11, and in contact with a wall of the at least one hole 11. For example, the at least one hole 11 includes a plurality of holes 11, the heat conductive portion 12 includes a plurality of heat conductive blocks 120, and each heat conductive block 120 is disposed in a respective one of the plurality of holes 11.

A thermal conductivity of the heat conductive portion 12 is greater than the thermal conductivity of the base 2. Herein, the thermal conductivity of the heat conductive portion 12 refers to a thermal conductivity of a material of the heat conductive portion 12, and the thermal conductivity of the base 2 refers to a thermal conductivity of a material (e.g., glass or PI) of the base 2.

The heat conductive portion 12 may be a metal heat conductive portion, an inorganic heat conductive portion, or an organic heat conductive portion, according to a type of a heat conductive material for forming the heat conductive portion 12. The metal heat conductive portion may be made of a metal material, for example, silver (Ag), aluminum (Al), or copper (Cu). A thermal conductivity of Ag is approximately 429 W/mK, a thermal conductivity of Al is approximately 237 W/mK, and a thermal conductivity of Cu is approximately 400 W/mK. The inorganic heat conductive portion may be made of, for example, silicon with a thermal conductivity of approximately 148 W/mK.

The heat conductive portion 12 may be obtained by filling the at least one hole 11 with the heat conductive material by an evaporation process, an electroplating process or a coating process.

The at least one piezoelectric sensor 10 is disposed on the base 2. In some examples, the at least one piezoelectric sensor 10 includes a plurality of piezoelectric sensors 10 arranged in an array. Of course, the piezoelectric sensors 10 may also be arranged in other ways according to actual needs, such as arranged in a certain pattern.

Each piezoelectric sensor 10 includes a first electrode 101, a piezoelectric pattern 103 and a second electrode 102 that are sequentially stacked in the thickness direction of the base 2, and the piezoelectric pattern 103 is made of a piezoelectric material. That is, in a same piezoelectric sensor 10, an orthographic projection of the first electrode 101, an orthographic projection of the piezoelectric pattern 103, and an orthographic projection of the second electrode 102 on the base 2 have overlapping regions.

The first electrode 101 and the second electrode 102 in the piezoelectric sensor 10 are insulated from each other. The first electrode 101 or the second electrode 102 is made of a metal or a transparent conductive oxide. The metal includes at least one of a metal element and an alloy. The metal element may be, for example, Ag, Al or Cu, and the transparent conductive oxide may be indium tin oxide (ITO) or indium zinc oxide (IZO).

The piezoelectric sensor 10 may include one or more first electrodes 101. In a case where the piezoelectric sensor 10 includes a plurality of piezoelectric sensors 10, first electrodes 101 in different piezoelectric sensors 10 are insulated from each other. Second electrodes 102 in the plurality of piezoelectric sensors 10 may be separately disposed, or may be connected to each other to form an integrated structure, which is not limited in the embodiments of the present disclosure, as long as it may be ensured that each piezoelectric sensor 10 may be separately controlled.

It will be noted that, the piezoelectric sensor 10 may be disposed on a surface of the base 2, or an insulating layer may be disposed between the piezoelectric sensor 10 and the base 2, and the piezoelectric sensor 10 and the base 2 are in contact with two opposite surfaces of the insulating layer, respectively. In the case where there are the plurality of piezoelectric sensors 10, as long as it is ensured that the plurality of piezoelectric sensors 10 are not short-circuited due to an existence of the heat conductive portion 12 in the at least one hole 11.

The piezoelectric pattern 103 in the piezoelectric sensor 10 is made of the piezoelectric material. For example, the piezoelectric material is a ferroelectric polymer, such as poly vinyledene fluoride-trifluoroethylene (PVDF-TrFE), polyvinylidene fluoride (PVDF), polymethyl methacrylate (PMMA), or polytetrafluoroethylene (PTFE).

When a piezoelectric material subjected to a polarization treatment is subjected to an external force, opposite charges are generated on two opposite surfaces of the piezoelectric material in a polarization direction. This process is referred to as a positive piezoelectric effect. In contrast, when voltages are applied to electrodes on two opposite sides of the piezoelectric material (e.g., the first electrode 101 and the second electrode 102 on two opposite sides of the piezoelectric pattern 103), the piezoelectric material is in an electric field, and elongated stress or compressed stress (mechanical stress) will be generated within the piezoelectric material. This process is referred to as an inverse piezoelectric effect. In this case, If high-frequency voltages are applied, high-frequency mechanical vibration, i.e., ultrasonic signals are generated.

The piezoelectric sensor 10 operates mainly by using the positive piezoelectric effect and the inverse piezoelectric effect of the piezoelectric material. The polarization treatment herein means that after the piezoelectric pattern 103 or a piezoelectric film for forming the piezoelectric pattern 103 is formed, the polarization treatment is performed on the piezoelectric pattern 103 or the piezoelectric film by applying an external electric field perpendicular to the base 2, so that electric domains inside the piezoelectric pattern 103 or the piezoelectric film are arranged in order in a direction of the electric field.

It will be understood that, in a case where the piezoelectric material is applied to the piezoelectric sensor 10, a structure (i.e., the piezoelectric pattern 103) formed by the piezoelectric material needs to be subjected to the polarization treatment, so as to make a piezoelectric performance of the piezoelectric material well embodied.

By taking an example in which the piezoelectric sensor 10 is used for the fingerprint identification, the piezoelectric pattern 103 generates and emits ultrasonic signals under action of an electric field generated by the first electrode 101 and the second electrode 102. The ultrasonic signals will be reflected when blocked by a finger. After receiving the reflected ultrasonic signals, the piezoelectric pattern 103 converts the received ultrasonic signals into corresponding electrical signals. On this basis, the electrical signals may be transmitted to, for example, a processor through the first electrode 101 and the second electrode 102. Finally, a corresponding image of a fingerprint is obtained through specific calculation by the processor.

Figure 3:
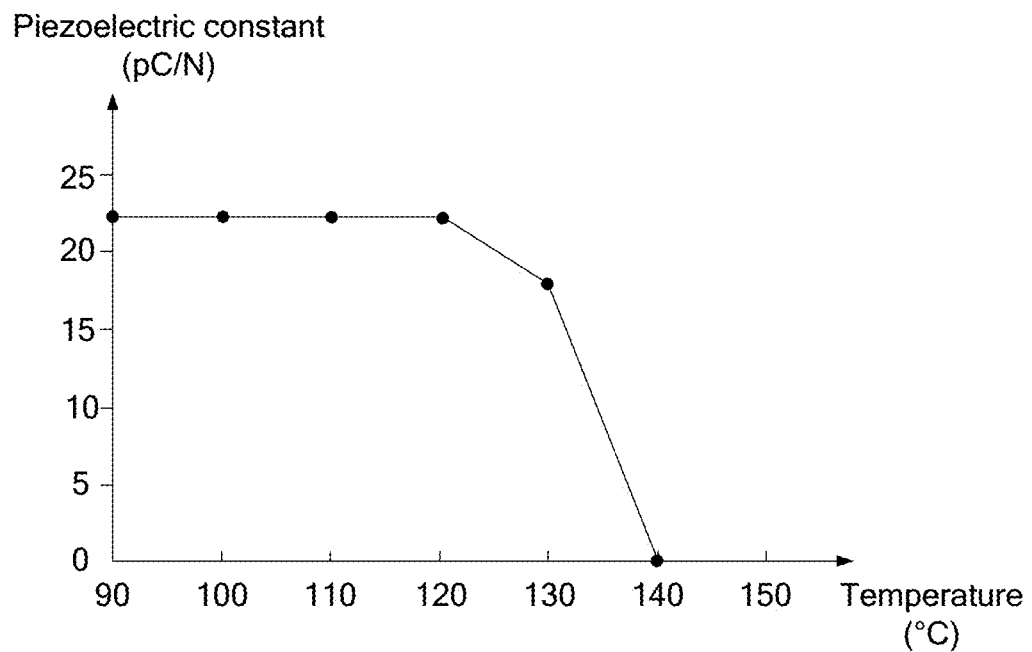
FIG. 3 is a graph showing a relationship between the temperature and a piezoelectric constant of a piezoelectric material in a piezoelectric sensor, in accordance with some embodiments.

However, a piezoelectric constant of the piezoelectric material is affected by temperature. By taking an example in which the piezoelectric material is PVDF, as shown in FIG. 3, as the temperature increases, the piezoelectric constant of PVDF decreases. Especially when the temperature is greater than 130° C., the piezoelectric constant of PVDF decreases sharply, thereby causing a decrease in a vibration frequency generated by the piezoelectric material. Thus, not only is an identification accuracy of the piezoelectric sensor 10 reduced, but also power consumption of the piezoelectric sensor 10 is increased. Herein, it is only to explain a trend of an impact of the temperature on the piezoelectric material, and not to limit the temperature at which the characteristics of the piezoelectric material change drastically.

It will be noted that, a relationship between the piezoelectric constant and temperature in FIG. 3 is described by taking the example in which the piezoelectric material is PVDF. In a case where the piezoelectric material is another material, the relationship between the piezoelectric constant of the piezoelectric material and the temperature has similar change characteristics to the PVDF material.

Moreover, the piezoelectric material will generate heat in a process of generating high-frequency vibration to emit the ultrasonic signals by being excited by an electric field, and a large amount of heat will also be generated in a process of manufacturing the piezoelectric sensor 10. As will be seen from the above description, if the heat cannot be transferred and dissipated in time, performances of the piezoelectric sensor 10 will be affected.

In the piezoelectric device 1 provided by the embodiments of the present disclosure, the base 2 is provided with the at least one hole 11. The at least one hole 11 is filled with the heat conductive material, and the thermal conductivity of the heat conductive material is greater than the thermal conductivity of the base 2.

In this way, on one hand, the heat conductive portion 12 may make the heat generated by the piezoelectric sensor 10 to be quickly conducted to an outer side of the piezoelectric device 1 toward a side away from the piezoelectric sensor 10 through the heat conductive portion 12, without being accumulated in the base 2. Therefore, the heat may be prevented from being continuously accumulated in the piezoelectric sensor 10, thereby improving a heat dissipation efficiency and a heat dissipation performance of the whole piezoelectric device 1. After a heat dissipation performance of the piezoelectric device 1 is improved, a working performance and an identification accuracy of the piezoelectric sensor 10 may be ensured, and the power consumption of the piezoelectric sensor 10 may be reduced. On another hand, the heat generated in the process of manufacturing the piezoelectric sensor 10 may also be quickly conducted to the outer side of the piezoelectric device 1 toward the side away from the piezoelectric sensor 10. Therefore, an impact of high temperature on the piezoelectric constant of the piezoelectric sensor 10 is avoided, thereby ensuring the working performance of the piezoelectric device 1.

Optionally, the thermal conductivity of the heat conductive portion 12 is in a range from approximately 120 W/mK to approximately 450 W/mK, such as, 150 W/mK, 200 W/m K, 240 W/m K, 300 W/m K, 350 W/m K, 380 W/m K, 400 W/mK, 430 W/m K, or 450 W/mK. The thermal conductivity of the heat conductive portion 12 is much greater than the thermal conductivity of the base 2 (e.g., 1.1 W/mK or 0.15 W/mK). Therefore, compared with a base of a same thickness and without the heat conductive portion 12, the base 2 provided with the heat conductive portion 12 in the embodiments of the present disclosure may make the heat transferred to the side away from the piezoelectric sensor 10 more quickly, thereby dissipating the heat quickly.

Figure 4A:
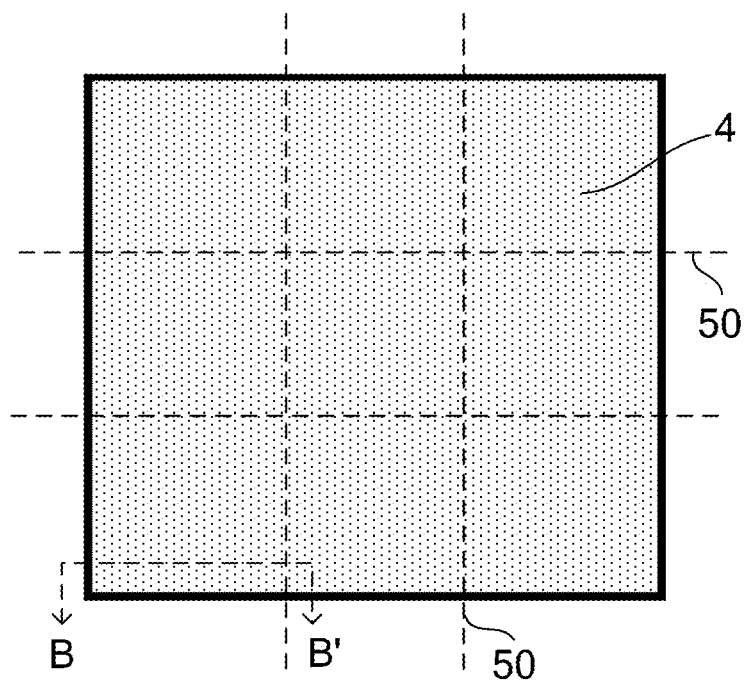
FIG. 4A is a schematic diagram showing a method for manufacturing a piezoelectric layer of a piezoelectric device in the related art.
Figure 4B:
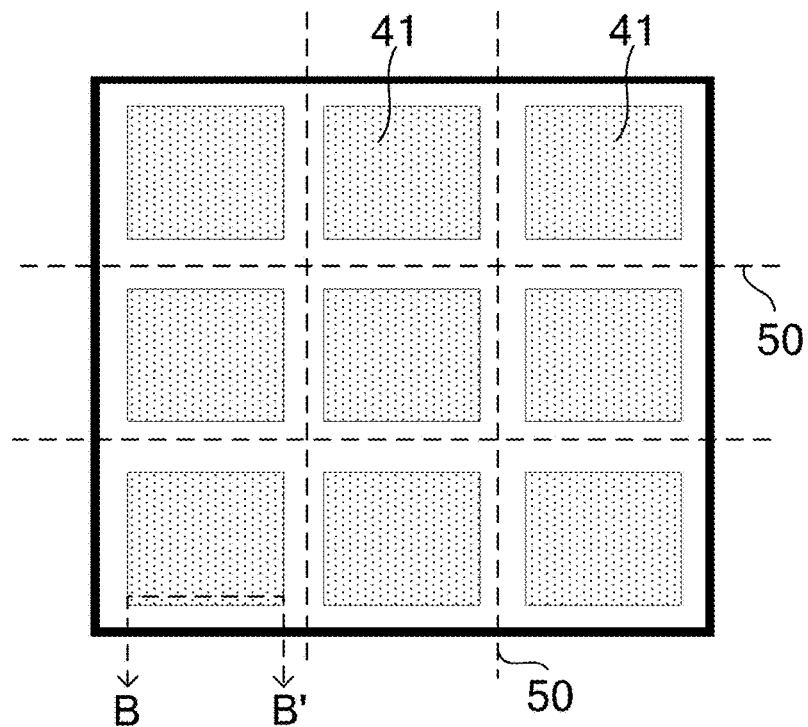
FIG. 4B is a schematic diagram showing another method for manufacturing the piezoelectric layer of the piezoelectric device in the related art.
Figure 4C:
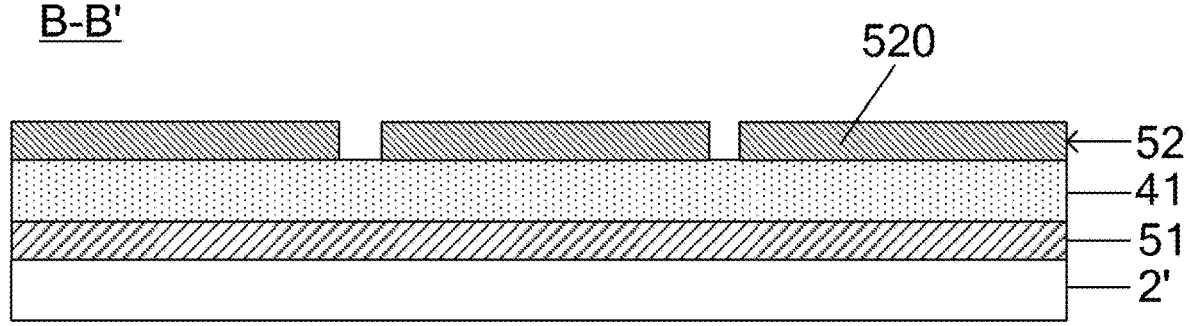
FIG. 4C is a schematic diagram of the piezoelectric sensor in the related art.

FIG. 4C shows a structure of an illustrative piezoelectric sensor in the related art. The piezoelectric sensor includes a base 2', and a lower electrode 51, a piezoelectric layer 41, and an upper electrode 52 that are sequentially stacked on the base 2'. As shown in FIG. 4C, the upper electrode 52 may include a plurality of sub-electrodes 520 spaced apart from each other, or may be one electrode.

In the related art, the piezoelectric sensor may be formed in the following two methods.

In one method, as shown in FIG. 4A, a piezoelectric film 4 is formed on a motherboard base on which a lower electrode layer is formed by a spin coating process, and an upper electrode layer is formed on the piezoelectric film 4. Then, a motherboard including the piezoelectric film 4 is cut into a plurality of small pieces along cutting lines 50 intersecting each other horizontally and vertically, and each small piece serves as one piezoelectric sensor, thereby obtaining the piezoelectric sensor shown in FIG. 4C, and the piezoelectric layer 41 in the piezoelectric sensor has a whole-layer structure.

In the other method, as shown in FIG. 4B, a plurality of piezoelectric layers 41 spaced apart from each other are formed on a motherboard base on which a lower electrode layer is formed by a slot blade coating process, and an upper electrode layer is formed on the piezoelectric layers 41. Then, a motherboard region corresponding to each piezoelectric layer 41 is cut along cutting lines 50 intersecting each other horizontally and vertically, and the motherboard region after being cut serves as one piezoelectric sensor, thereby obtaining the piezoelectric sensor shown in FIG. 4C, and the piezoelectric layer 41 in the piezoelectric sensor has a whole-layer structure.

In the above related art, limited by cutting technology, a size of the piezoelectric layer 41 in the cut piezoelectric sensor is at least in an order of millimeters. However, a measurement accuracy of the piezoelectric sensor including the piezoelectric layer 41 of a millimeter-scale size or even a larger size is low, Therefore, the piezoelectric sensor 1 cannot accurately measure a region of a smaller size (i.e., a size less than the size of the piezoelectric layer 41).

In some embodiments of the present disclosure, the at least one piezoelectric sensor 10 includes a plurality of piezoelectric sensors 10 spaced apart from each other. Each piezoelectric sensor 10 includes a first electrode 101, a piezoelectric pattern 103, and a second electrode 102. First electrodes 101 in different piezoelectric sensors 10 are insulated from each other. Therefore, each piezoelectric sensor 10 may be separately controlled.

A sum of regions where all piezoelectric sensors 10 are located is a measurement region of the piezoelectric device 1, and a region where each piezoelectric sensor 10 is located may be regarded as a measurement sub-region. Since each piezoelectric sensor 10 may be separately controlled, a measurement sub-region corresponding to each piezoelectric sensor 10 may be separately measured. That is, the piezoelectric device 1 is capable of separately measuring the measurement sub-region having a size equivalent to a size of the piezoelectric pattern 103, thereby improving the measurement accuracy of the piezoelectric device 1.

Optionally, a size of the piezoelectric pattern 103 is in an order of micrometers or nanometers. That is, a length of each side of the piezoelectric pattern 103 may be less than 1,000 micrometers, or further may be less than 1,000 nanometers. The smaller the size of the piezoelectric pattern 103 is, the smaller the size of the measurement sub-region is, the greater the number of measurement sub-regions in a measurement region of a same area, then the higher the measurement accuracy is. Therefore, in the embodiments of the present disclosure, a measurement accuracy of a piezoelectric pattern 103 of a micrometer-scale size or a nanometer-scale size is higher than a measurement accuracy of a piezoelectric pattern of a millimeter-scale size obtained by cutting in the above related art.

In a direction parallel to the base 2, a shape of a section (i.e., cross-section) of any hole 11 may be a circle, an ellipse, a rectangle, a long strip or other irregular patterns, the embodiments of the present disclosure do not limit this.

Figure 2A:
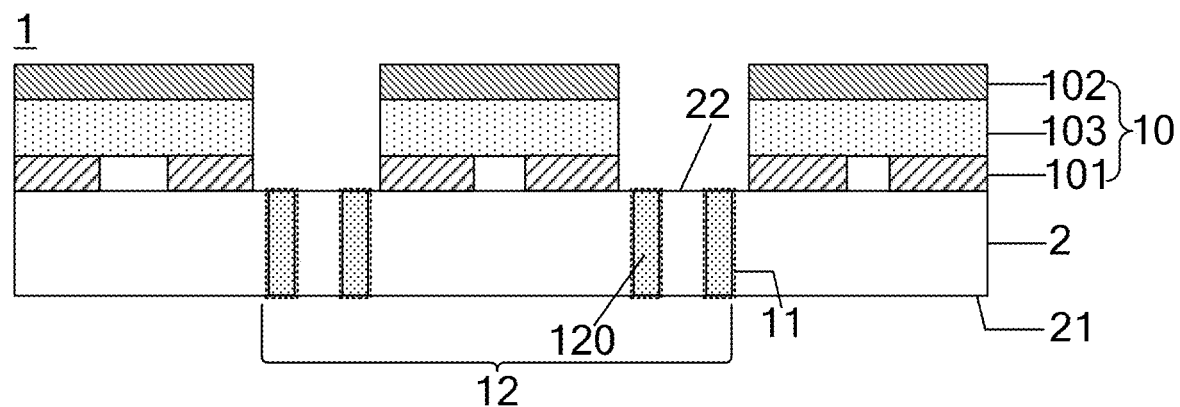
FIG. 2A is a schematic diagram of yet another piezoelectric device, in accordance with some embodiments.

In some embodiments, as shown in FIGS. 1A and 2A, the holes 11 penetrate the base 2. That is, in the thickness direction of the base 2, a depth of the holes 11 is equal to the thickness of the base 2. In this case, the holes 11 are through holes (i.e., openings) formed in the base 2.

In some other embodiments, as shown in FIGS. 1B to 1E, 2B and 2C, in the thickness direction of the base 2, the depth of the hole 11 is less than the thickness of the base 2, that is, the hole 11 does not penetrate the base 2. In this case, the hole 11 is a blind hole (i.e., a groove) formed in the base 2.

Optionally, as shown in FIGS. 1B, 1D, 1E and 2B, the hole 11 is disposed in a first surface 21 of the base 2, the piezoelectric sensors 10 are disposed on a second surface 22 of the base 2. The first surface 21 and the second surface 22 are two opposite surfaces in the thickness direction of the base 2. By arranging the piezoelectric sensors 10 and the heat conductive portion 12 at two opposite sides of the base 2 respectively, a flat bearing surface may be provided for the piezoelectric sensors 10 to ensure that different piezoelectric sensors 10 are at a same height, thereby ensuring that a distance from each piezoelectric sensor 10 to a detection surface (i.e., a surface in contact with the finger) is equal in the case where the piezoelectric device 1 is applied to the fingerprint identification.

In some embodiments, as shown in FIGS. 1A to 1C, 1E and 2A to 2C, in the thickness direction of the base 2, a thickness of the heat conductive portion 12 is equal to the depth of the hole 11.

That is, in a case where the hole 11 is a through hole, the first surface 21 and a surface of the heat conductive portion 12 facing the first surface 21 are in a same plane (or approximately in a same plane), and the second surface 22 and a surface of the heat conductive portion 12 facing the second surface 22 are in a same plane (or approximately in a same plane). In a case where the hole 11 is a blind hole, a corresponding surface (i.e., the first surface 21 or the second surface 22) of the base 2 where the blind hole is located and a surface of the heat conductive portion 12 facing the corresponding surface are in a same plane (or approximately in a same plane).

The thermal conductivity of the heat conductive portion 12 is greater than the thermal conductivity of the base 2. Therefore, the heat conductive portion 12 is disposed in the hole 11, and the thickness of the heat conductive portion 12 is equal to the depth of the hole 11, which is conductive to improving a heat conducting capability of the base 2, so that the heat may be dissipated quickly. The one of two surfaces of the heat conductive portion 12 and the corresponding surface(s) of the base 2 being in the same plane facilitates subsequent manufacturing of the piezoelectric sensor 10 on the base 2.

Figure 1B:
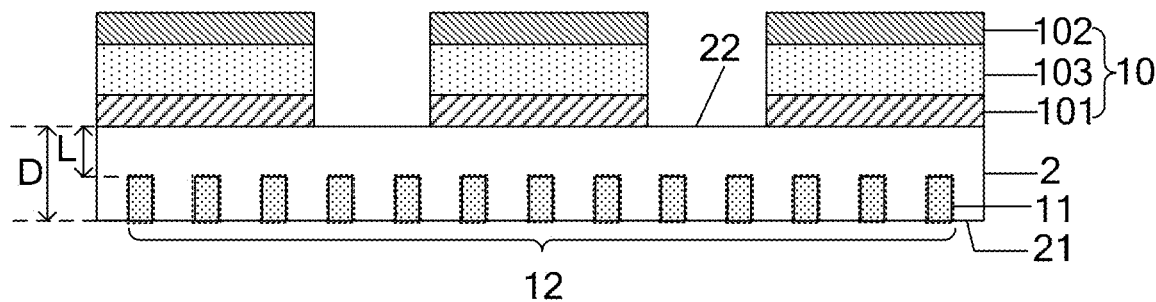
FIG. 1B is a schematic diagram of another piezoelectric device, in accordance with some embodiments.

Of course, the thickness of the heat conductive portion 12 may be less than or greater than the depth of the hole 11, which is not limited in the embodiments of the present disclosure. In a case where the thickness of the heat conductive portion 12 is less than the depth of the hole 11, a structure of the piezoelectric device 1 is as shown in FIG. 1D. That is, the holes 11 are not filled with the heat conductive portion 12. In a case where the thickness of the heat conductive portion 12 is greater than the depth of the hole 11, a part of the heat conductive portion 12 protrudes from the hole 11.

In some examples, as shown in FIGS. 1A, 1C, 2A and 2C, in the thickness direction of the base 2, a distance between the piezoelectric sensor 10 and the heat conductive portion 12 is zero.

For example, as shown in FIGS. 1A and 2A, the holes 11 penetrate the base 2, one of the two opposite surfaces of the heat conductive portion 12 and the first surface 21 of the base 2 are in the same plane, and the other of the two opposite surfaces of the heat conductive portion 12 and the second surface 22 of the base 2 are in the same plane. The piezoelectric sensors 10 are disposed on the second surface 22 of the base 2.

Figure 1C:
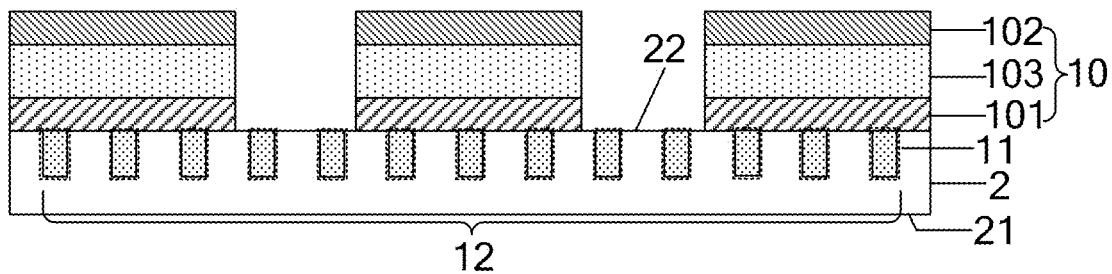
FIG. 1C is a schematic diagram of yet another piezoelectric device, in accordance with some embodiments.
Figure 1D:
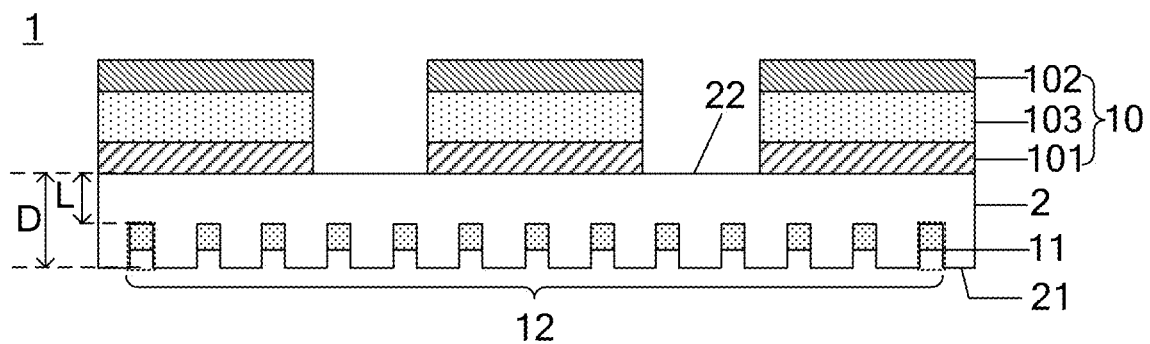
FIG. 1D is a schematic diagram of yet another piezoelectric device, in accordance with some embodiments.
Figure 2B:
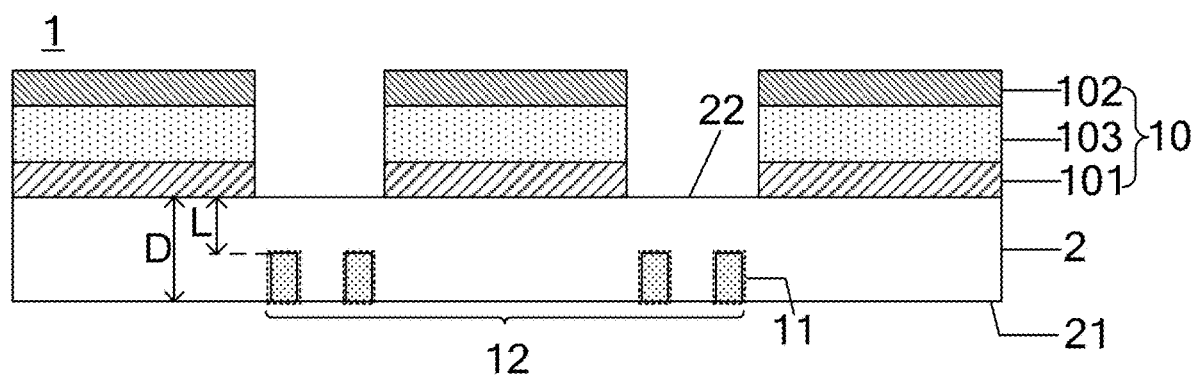
FIG. 2B is a schematic diagram of yet another piezoelectric device, in accordance with some embodiments.
Figure 2C:
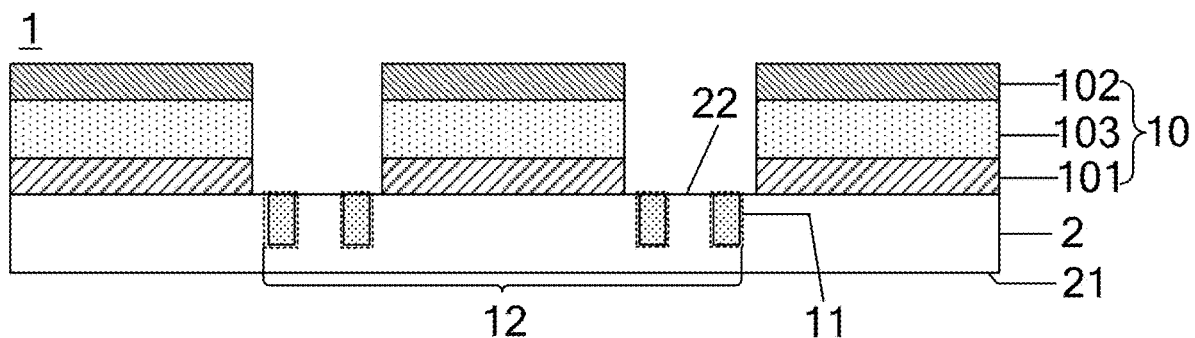
FIG. 2C is a schematic diagram of yet another piezoelectric device, in accordance with some embodiments.

For another example, as shown in FIGS. 1C and 2C, the holes 11 and the piezoelectric sensors 10 are located at a same side of the base 2, and one surface of the heat conductive portion 12 and the second surface 22 of the base 2 are in the same plane. The distance between the piezoelectric sensor 10 and the heat conductive portion 12 is small, which is conducive to the heat dissipation.

In some other examples, as shown in FIGS. 1B, 1D, 1E and 2B, the hole 11 and the piezoelectric sensors 10 are located at different sides of the base 2. In the thickness direction of the base 2, the distance between the piezoelectric sensor 10 and the heat conductive portion 12 is set as L, and L is greater than zero and less than the thickness of the base 2. In this case, the thickness of a part of the base 2 provided with the hole 11 is small, and the heat conductive portion 12 in the hole 11 has a strong heat conducting capability, which is conducive to the heat dissipation.

It will be seen that, regardless whether the distance between the piezoelectric sensor 10 and the heat conductive portion 12 is equal to L or zero, the distance between the piezoelectric sensor 10 and the heat conductive portion 12 is less than the thickness D of the base 2. Therefore, the heat may be quickly transferred from the piezoelectric sensor 10 to the heat conductive portion 12, and is then conducted to the outer side of the piezoelectric device 1 in a direction away from the piezoelectric sensor 10 through the heat conductive portion 12.

Figure 1E:
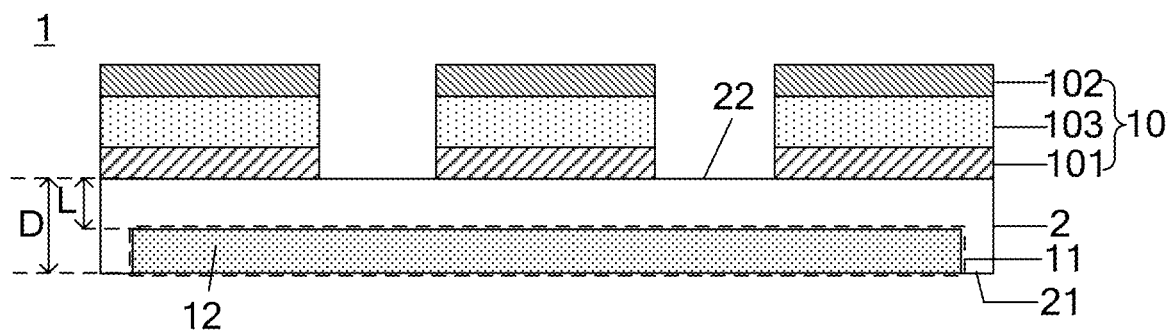
FIG. 1E is a schematic diagram of yet another piezoelectric device, in accordance with some embodiments.

In some embodiments, as shown in FIG. 1E, there is one hole 11 having a large cross-section. The one hole 11 may be disposed in a middle position of the base 2, and the one hole 11 overlaps with orthographic projections of the plurality of piezoelectric sensors 10 on the base 2.

In some other embodiments, as shown in FIGS. 1A to 1D and 2A to 2C, there are a plurality of holes 11 spaced apart from each other. That is, there is a spacing between adjacent holes 11. By spacing apart the plurality of holes 11 in the base 2, a good bearing capacity of the base 2 in the process of manufacturing the piezoelectric sensor 10 may be ensured.

In some examples, as shown in FIGS. 2A to 2C, the orthographic projections of the piezoelectric sensors 10 on the base 2 do not overlap with any hole 11. For example, as shown in FIGS. 2A to 2C, one or more holes 11 are disposed between every two adjacent piezoelectric sensors 10.

The piezoelectric pattern 103 in the piezoelectric sensor 10 is manufactured by using a patterning process, and the patterning process includes processes such as exposure, development and etching. In the etching process (e.g., a dry etching process), a large amount of heat will be generated. An etched region is exactly between two adjacent piezoelectric sensors 10, that is, a large amount of heat will be generated in the etched region between the two adjacent piezoelectric sensors 10. Therefore, in order to reduce an impact of a temperature increase on the piezoelectric material in the manufacturing process, the holes 11 are disposed between two adjacent piezoelectric sensors 10. Moreover, by arranging the holes 11 between two adjacent piezoelectric sensors 10, dissipation of heat generated by the piezoelectric device 1 during operation will not be affected, that is, the heat may still be dissipated quickly through the heat conductive portion 12.

In some other examples, as shown in FIGS. 1A to 1E, the orthographic projections of the piezoelectric sensors 10 on the base 2 overlap with at least one of the plurality of holes 11. For example, as shown in FIGS. 1A to 1D, some of the plurality of holes 11 are disposed at positions where all piezoelectric sensors 10 face the base 2, and the remaining holes 11 are disposed in regions of the base 2 where the piezoelectric sensors 10 are not disposed.

In this way, by arranging a plurality of holes 11 in regions of the base 2 facing the piezoelectric sensors 10 and regions between the piezoelectric sensors 10, an overall heat dissipation effect of the piezoelectric device 1 may be improved, thereby better ensuring the performance of the piezoelectric device 1.

Figure 5A:
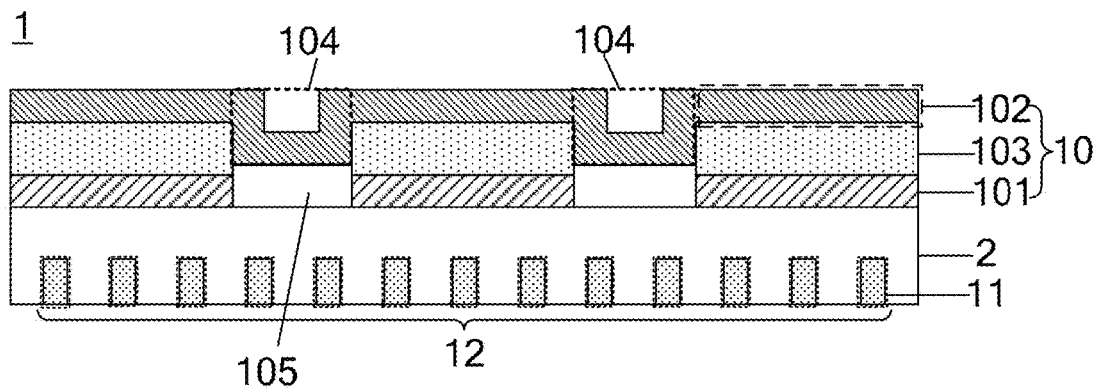
FIG. 5A is a schematic diagram of yet another piezoelectric device, in accordance with some embodiments.
Figure 5B:
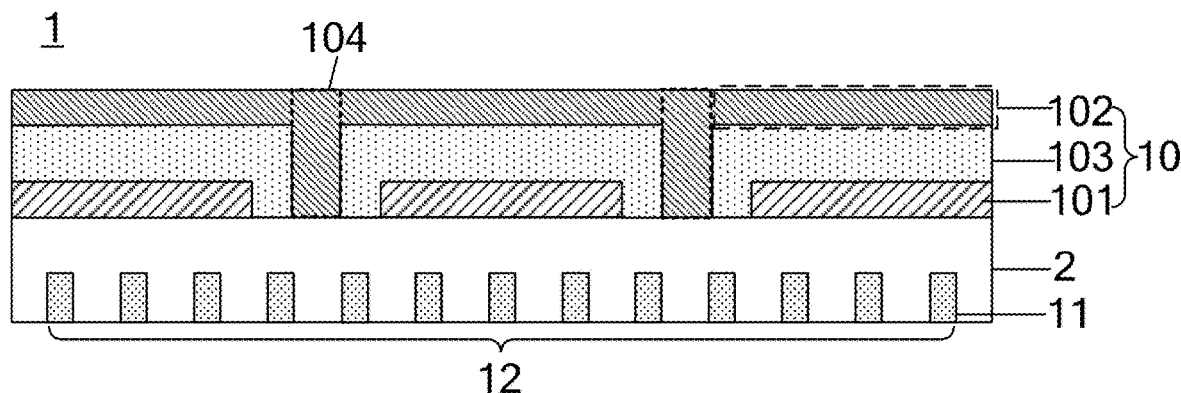
FIG. 5B is a schematic diagram of yet another piezoelectric device, in accordance with some embodiments.

In some embodiments, as shown in FIGS. 5A and 5B, in a case where the piezoelectric device 1 includes the plurality of piezoelectric sensors 10, the second electrodes 102 in all piezoelectric sensors 10 are electrically connected through at least one connecting electrode 104, and all second electrodes 102 and all connecting electrodes 104 are disposed in a same layer. For example, the piezoelectric device 1 further includes a plurality of connecting electrodes 104, second electrodes 102 in every two adjacent piezoelectric sensors 10 are electrically connected through one connecting electrode 104, and all second electrodes 102 and all connecting electrodes 104 may form an integrated structure. Therefore, a circuit of the piezoelectric device 1 is relatively simple.

The term "same layer" herein refers to a layer structure formed by a same patterning process by using a same mask in which a film for forming specific patterns is formed by using a same film-forming process. Depending on the specific patterns, the same patterning process may include exposure, development and etching, and the specific patterns formed in the layer structure may be continuous or discontinuous, and these specific patterns may also be at different heights or have different thicknesses.

That is, the second electrodes 102 and the connecting electrodes 104 are manufactured based on a same film by the same patterning process. Therefore, a manufacturing process of the piezoelectric device 1 is simple, and circuit wiring of the piezoelectric device 1 may be simplified.

A part of the connecting electrode 104 is located between two adjacent piezoelectric patterns 103, and the first electrode 101 and the second electrode 102 in the same piezoelectric sensor 10 need to be insulated from each other. Therefore, the first electrode 101 and the connecting electrode 104 also need to be insulated from each other. In order to ensure that the first electrode 101 and the connecting electrode 104 are insulated from each other, the first electrode 101 and the piezoelectric pattern 103 may be arranged in any of the following two methods.

In some examples, as shown in FIG. 5A, a side edge of the piezoelectric pattern 103 in each piezoelectric sensor 10 and a side edge of the first electrode 101 located at an edge of the piezoelectric sensor 10 that is proximate to an adjacent piezoelectric sensor 10 are substantially in a same plane.

For example, in a case where each piezoelectric sensor 10 includes one first electrode 101, in the thickness direction of the base 2, the orthographic projection of the piezoelectric pattern 103 on the base 2 completely overlaps with the orthographic projection of the first electrode 101 on the base 2. For another example, in a case where each piezoelectric sensor 10 includes two first electrodes 101, one of two side edges of the piezoelectric pattern 103 and a side edge of one of the two first electrodes 101 that is proximate to an adjacent piezoelectric sensor 10 are substantially in a same plane, and the other of the two side edges of the piezoelectric pattern 103 and a side edge of the other of the two first electrodes 101 that is proximate to an adjacent piezoelectric sensor 10 are substantially in a same plane.

In this case, as shown in FIG. 5A, the piezoelectric device 1 further includes an insulating layer 105 disposed between first electrodes 101 of adjacent piezoelectric sensors 10, and the connecting electrode 104 is located at a side of the insulating layer 105 facing away from the base 2. A thickness of the insulating layer 105 may be greater than or equal to a thickness of the first electrode 101, as long as it may be ensured that the connecting electrode 104 is not in contact with the first electrode 101.

Further, In the case where each piezoelectric sensor 10 includes one first electrode 101, since the piezoelectric pattern 103 and the first electrode 101 have a same shape, the piezoelectric pattern 103 and the first electrode 101 may be separately patterned by using a same mask, thereby reducing a manufacturing cost.

In some other examples, as shown in FIG. 5B, in each piezoelectric sensor 10, in the thickness direction of the base 2, an orthographic projection of any first electrode 101 on the base 2 is within a range of the orthographic projection of the piezoelectric pattern 103 on the base 2, and side faces of any first electrode 101 is covered by the piezoelectric pattern 103. In this case, the connecting electrode 104 is located between the adjacent piezoelectric patterns 103, which ensures that the first electrode 101 and the connecting electrode 104 are insulated from each other. A large area of the piezoelectric pattern 103 enables a spacing between two adjacent piezoelectric patterns 103 to reduce. Therefore, the measurement accuracy of the piezoelectric device 1 is high.

Figure 6:
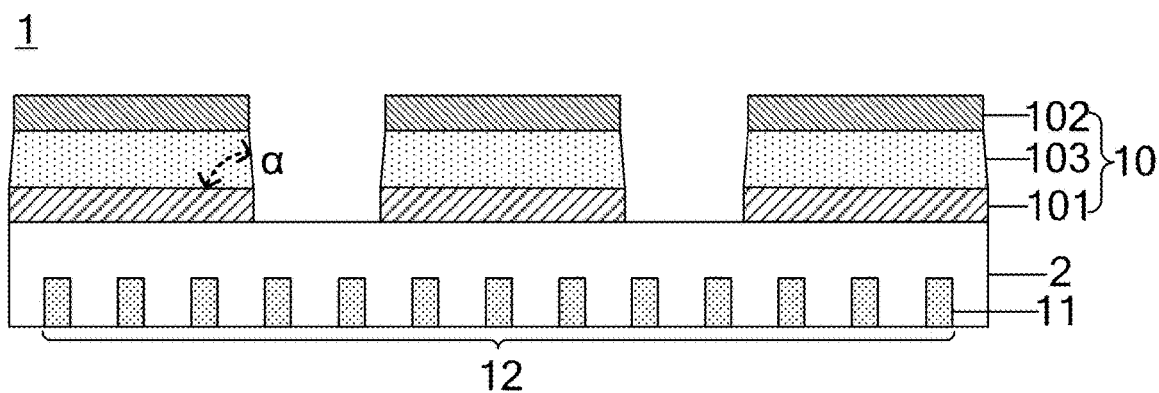
FIG. 6 is a schematic diagram of yet another piezoelectric device, in accordance with some embodiments.

Optionally, an included angle α between a plane where a sidewall of the piezoelectric pattern 103 is located and the base 2 is in a range from approximately 85° to approximately 90°, such as 85°, 87° or 90°. The sidewall of the piezoelectric pattern 103 herein refers to a side edge of the piezoelectric pattern 103, i.e., a side that is not parallel to the second surface 22 of the base 2. In some examples, as shown in FIGS. 1A to 2C, the included angle α is equal to 90°. In some other examples, as shown in FIG. 6, the included angle α is equal to 85°.

The includes angle α between the plane where the sidewall of the piezoelectric pattern 103 is located and the base 2 is in the range from approximately 85° to approximately 90°, which may make a size of an upper surface (i.e., a surface facing away from the base 2 in the thickness direction of the base 2) of the piezoelectric pattern 103 proximate to a size of a lower surface (i.e., a surface facing the base 2 in the thickness direction of the base 2).

The smaller the spacing between two adjacent piezoelectric patterns 103 is, the more piezoelectric sensors 10 may be disposed in the piezoelectric device 1 of a certain size, and thus the higher the measurement accuracy of the piezoelectric device is. The closer the sizes of the upper surface and the lower surface of the piezoelectric pattern 103 are, the smaller the spacing between two adjacent piezoelectric patterns 103 is. Therefore, in a case where the included angle α between the plane where the sidewall of the piezoelectric pattern 103 is located and the base 2 is in the range from approximately 85° to approximately 90°, the measurement accuracy of the piezoelectric device 1 may be made high.

Figure 7:
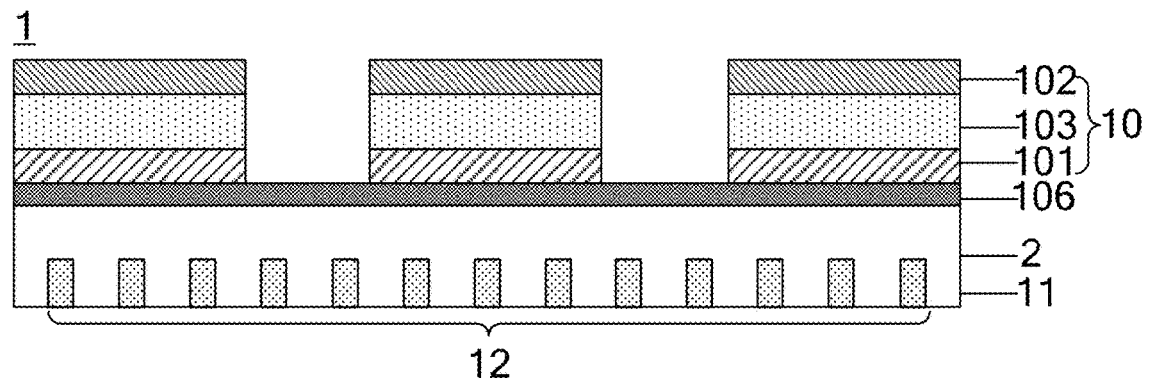
FIG. 7 is a schematic diagram of yet another piezoelectric device, in accordance with some embodiments.

Optionally, as shown in FIG. 7, the piezoelectric device 1 further includes a driving circuit layer 106 disposed between the base 2 and the piezoelectric sensors 10. The driving circuit layer 106 is configured to provide a voltage to the first electrode 101 in each piezoelectric sensor 10, separately. A circuit connection relationship of the driving circuit layer 106 may be determined according to circuit design needs, and is not limited in the embodiments of the present disclosure herein.

For example, the driving circuit layer 106 includes a plurality of driving circuits each corresponding to a respective one of the plurality of piezoelectric sensors 10, and each driving circuit includes at least one transistor (e.g., thin film transistor, TFT). For example, each driving circuit includes one TFT to which one first electrode 101 in the piezoelectric sensor 10 is electrically connected.

Figure 8A:
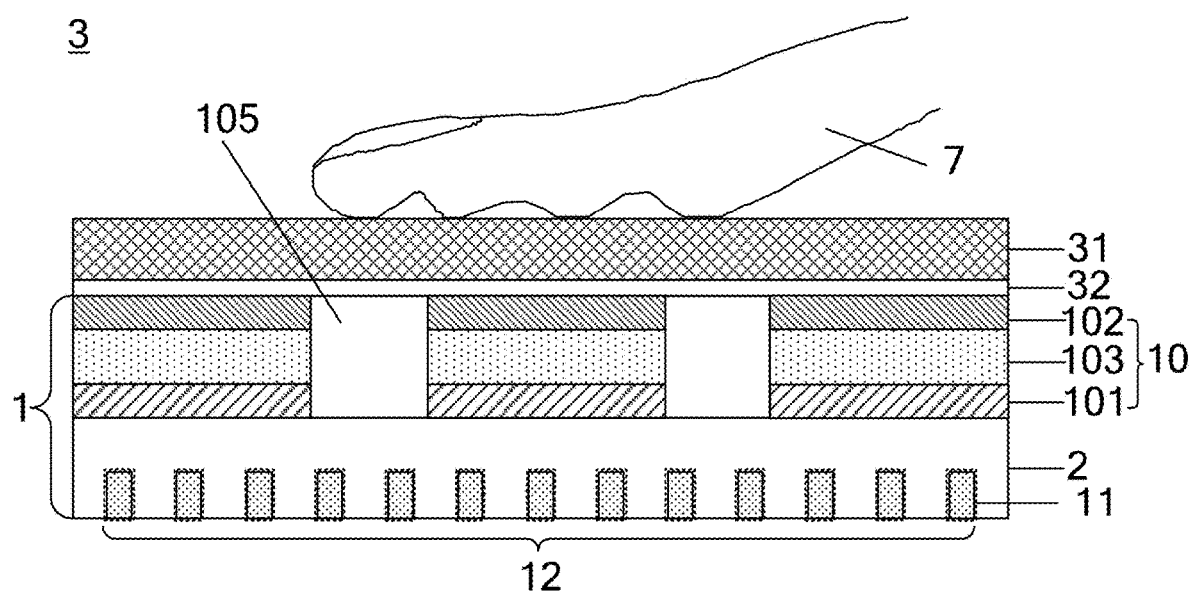
FIG. 8A is a schematic diagram of a display apparatus, in accordance with some embodiments.
Figure 8B:
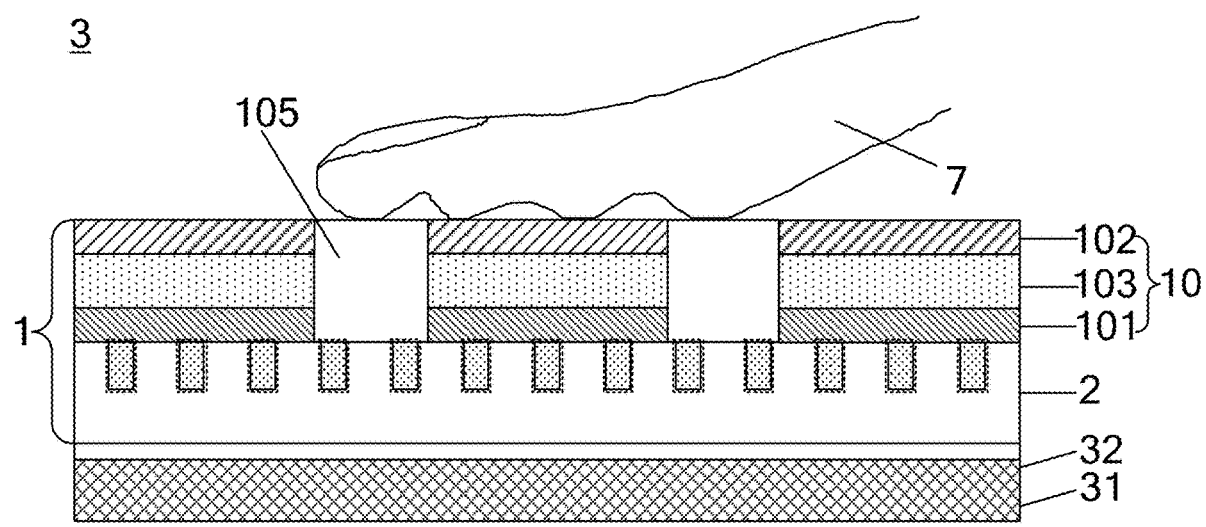
FIG. 8B is a schematic diagram of another display apparatus, in accordance with some embodiments.

Some embodiments of the present disclosure provide a display apparatus 3. As shown in FIGS. 8A and 8B, the display apparatus 3 includes a display panel 31 and the above piezoelectric device 1. The display panel 31 and the piezoelectric device 1 may be bonded together by using an adhesive layer 32.

In some examples, as shown in FIG. 8A, the piezoelectric device 1 is located at a side of the display panel 31 facing away from a light emitting surface, and the light emitting surface is one of a plurality of surfaces of the display panel 31 from which light is emitted. The piezoelectric device 1 is bonded to a surface of the display panel 31 facing away from the light emitting surface, for example, through the adhesive layer 32. In the display apparatus 3 having such a structure, the piezoelectric device 1 may be fully transparent, or translucent or opaque, which will not affect the light emitted from the display panel 31. Therefore, requirements for materials and processes of manufacturing the piezoelectric device 1 are low, and the manufacturing is relatively simple.

In some other examples, as shown in FIG. 8B, the piezoelectric device 1 is located on the light emitting surface of the display panel 31. The piezoelectric device 1, for example, is bonded to the light emitting surface of the display panel 31 through the adhesive layer 32. In the display apparatus 3 having such a structure, in order to reduce an impact on the light emitted from the display panel 31, all layers in the piezoelectric device 1 are required to be transparent layers or approximately transparent layers. Or, in a case where an amount of the emitted light required by the display panel 31 may be ensured, some of all layers in the piezoelectric device 1 are translucent film layers, and the remaining layers are transparent layers. The piezoelectric device 1 is located at a light exit side of the display panel 31, which may make a distance between the piezoelectric device 1 and the finger 7 more closer, thereby facilitating to improve the measurement accuracy of the piezoelectric device 1.

In a case where voltages are applied to the first electrode 101 and the second electrode 102, the piezoelectric pattern 103 formed by using the piezoelectric material may generate ultrasonic signals. This process is referred to as the inverse piezoelectric effect.

As shown in FIGS. 8A and 8B, when the ultrasonic signals generated by the piezoelectric patterns 103 contact a fingerprint on the finger 7, reflection interfaces contacted by the ultrasonic signals are different due to the presence of valleys and ridges on a surface of the fingerprint. An air interface corresponding to the valleys has a large impedance to the ultrasonic signals, which makes an amount of ultrasonic signals passing through the air interface be small, and thus an intensity of reflected ultrasonic signals be large. A solid interface corresponding to the ridges has a small impedance to the ultrasonic signals, which makes an amount of ultrasonic signals passing through the solid interface be large, and thus an intensity of reflected ultrasonic signals be small.

On this basis, when the ultrasonic signals reflected by the air interface and the solid interface are received by the piezoelectric patterns 103, the piezoelectric material of the piezoelectric patterns 103 will generate the positive piezoelectric effect, and will correspondingly generate a plurality of local charges accumulated on surfaces of a plurality of first electrodes 101, thereby generating corresponding electrical signals. An amount of each accumulated local charges is positively correlated with the intensity of the reflected ultrasonic signals that are received. Therefore, after an electrical signal generated by each first electrode 101 is processed, an image representing the fingerprint information may be obtained, thereby achieving a fingerprint identification function.

Figure 9A:
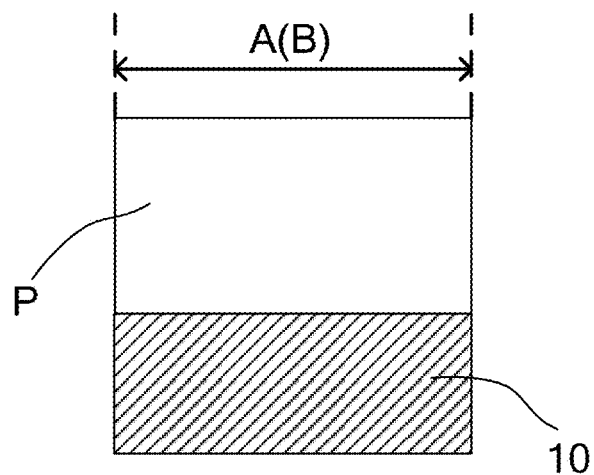
FIG. 9A is a schematic diagram showing a corresponding relationship between a sub-pixel and a piezoelectric sensor in a display apparatus, in accordance with some embodiments.
Figure 9B:
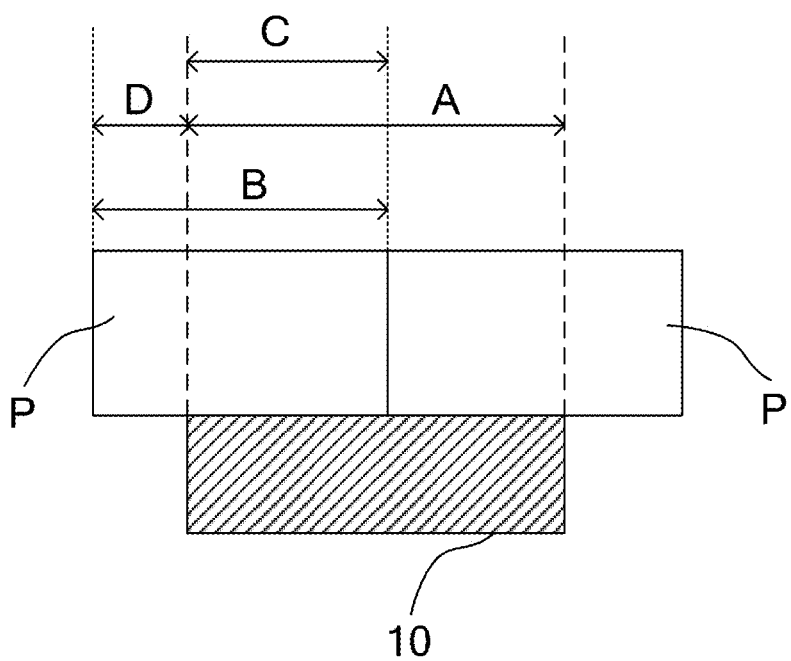
FIG. 9B is a schematic diagram showing another corresponding relationship between a sub-pixel and a piezoelectric sensor in a display apparatus, in accordance with some embodiments.

In some embodiments, the display panel 31 includes a plurality of sub-pixels. As shown in FIGS. 9A and 9B, an orthographic projection of the piezoelectric sensor 10 on the display panel 31 has an overlapping region with at least one sub-pixel P. That is, the orthographic projection of the piezoelectric sensor 10 on the display panel 31 overlaps with a region where the at least one sub-pixel P is located. Overlap herein includes full overlap and partial overlap.

The orthographic projection of the piezoelectric sensor 10 on the display panel 31 has an overlapping region with M sub-pixels P, and M is an integer greater than zero and less than four.

Optionally, as shown in FIG. 9A, the orthographic projection of the piezoelectric sensor 10 on the display panel 31 completely overlaps with a region where one sub-pixel P is located. In this case, the measurement accuracy of the piezoelectric device 1 may reach a sub-pixel level. For example, each sub-pixel P may correspond to a respective piezoelectric sensor 10, that is, an area of the measurement region of the piezoelectric device 1 is equal to a sum of areas of regions where all sub-pixels P are located, and an area of each measurement sub-region is equal to an area of a respective sub-pixel P.

In the display apparatus 3 having such a structure, the piezoelectric sensor 10 corresponding to each sub-pixel P may be separately controlled, and an orthographic projection of a measurement sub-region A of the piezoelectric device 1 on the display panel 31 completely overlaps with a region B where the sub-pixel P is located. Therefore, there is no part that cannot be measured in the measurement sub-region A corresponding to each sub-pixel P of the display panel 31, and an overall measurement accuracy of the display apparatus 3 is high.

Optionally, as shown in FIG. 9B, the orthographic projection of the piezoelectric sensor 10 on the display panel 31 overlaps with regions where two adjacent sub-pixels P are located. In this case, the measurement accuracy of the piezoelectric device 1 may also reach the sub-pixel level. For example, a measurement sub-region corresponding to the piezoelectric sensor 10 is a region A, a region where each sub-pixel is located is a region B, a region where the measurement sub-region A overlaps with the region B corresponding to the sub-pixel is a region C, and a region where the measurement sub-region A dose not overlap with the region B is a region D. In a sub-pixel P, the region C may be measured, while the region D cannot be measured. Therefore, in sub-pixels P, there are some regions that cannot be measured. By controlling sizes of these regions that cannot be measured, impacts of these regions on the measurement accuracy may be reduced or even ignored. As for the region B where each sub-pixel P is located, since the region C in the region B may be measured, the region corresponding to each sub-pixel P may still be measured.

The display apparatus 3 has same beneficial effects as the above piezoelectric device 1, which will not be repeated herein.

Figure 10A:
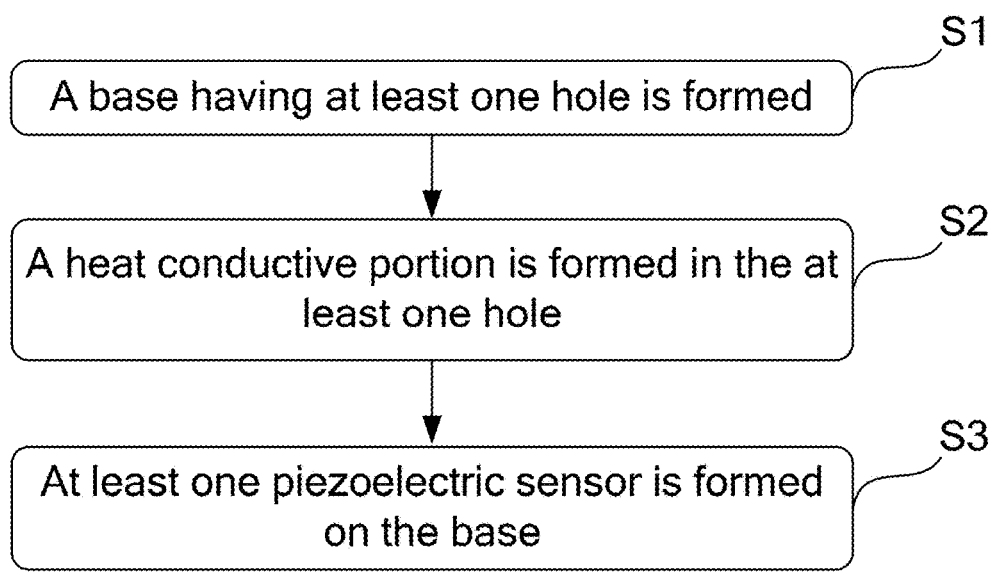
FIG. 10A is a flow diagram of a method for manufacturing a piezoelectric device, in accordance with some embodiments.

Some embodiments of the present disclosure provide a method for manufacturing the piezoelectric device 1, as shown in FIG. 10A, the method includes S1 to S3.

Figure 10B:
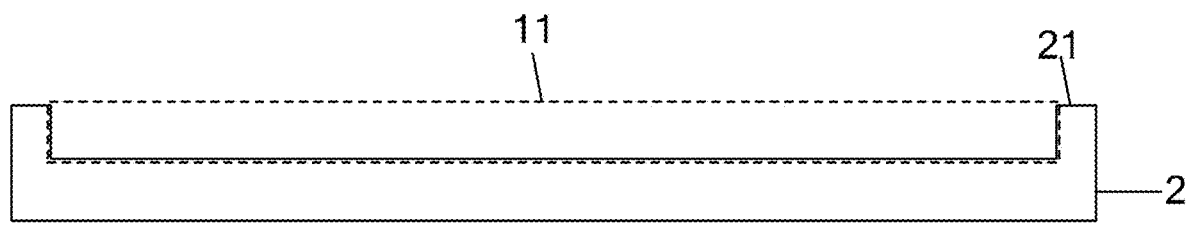
FIGS. 10B to 10C are schematic diagrams showing a process of manufacturing a piezoelectric device, in accordance with some embodiments.

In S1, as shown in FIG. 10B, a base 2 having at least one hole 11 is formed.

For example, the base 2 is a glass base, and a thickness of the glass base is in a range from approximately 0.4 mm to approximately 0.5 mm.

For example, S1 includes: forming at least one hole 11 in a substrate by a dry etching process, a wet etching process or a laser drilling process to obtain the base 2. Taking the wet etching process as an example, an etching liquid used in the wet etching process may be hydrofluoric acid (HF).

Figure 10C:
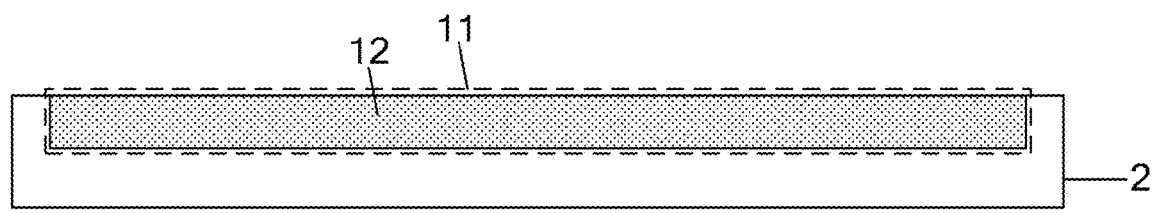

In S2, as shown in FIG. 10C, a heat conductive portion 12 is formed in the at least one hole 11. A thermal conductivity of the heat conductive portion 12 is greater than a thermal conductivity of the base 2.

For example, the heat conductive portion 12 is made of silver (Ag), aluminum (Al) or copper (Cu). A thermal conductivity of Ag is approximately 429 W/mK, a thermal conductivity of Al is approximately 237 W/mK, and a thermal conductivity of Cu is approximately 400 W/mK.

For example, S2 includes: filling the at least one hole 11 with a heat conductive material by an evaporation process, an electroplating process or a coating process to form the heat conductive portion 12.

For example, a thickness of the heat conductive portion 12 is substantially equal to a depth of the hole 11.

In S3, as shown in FIG. 1E, at least one piezoelectric sensor 10 is formed on the base 2. Each piezoelectric sensor 10 includes a first electrode 101, a piezoelectric pattern 103 and a second electrode 102 that are sequentially formed on the base 2.

The piezoelectric pattern 103 is made of a piezoelectric material, such as poly vinylidene fluoride (PVDF), poly vinyledene fluoride-trifluoroethylene (PVDF-TrFE), or polytetrafluoroethylene (PTFE).

In the method for manufacturing the piezoelectric device 1 provided by some embodiments of the present disclosure, at least one hole 11 is formed in the base 2, the heat conductive portion 12 is formed in the at least one hole 11, the thermal conductivity of the heat conductive portion 12 being greater than the thermal conductivity of the base 2, and then at least one piezoelectric sensor 10 is formed on the base 2.

In this way, on one hand, compared with a base of a same thickness and without the heat conductive portion 12, heat generated in a manufacturing process (e.g., the dry etching) of the piezoelectric sensor 10 may be quickly conducted to the outer side of the piezoelectric device 1 toward a side away from the piezoelectric pattern 103, thereby preventing the heat from being accumulated in the piezoelectric pattern 103, and further preventing a temperature rise from affecting a piezoelectric constant of the piezoelectric pattern 103. On another hand, heat generated during operation of the piezoelectric device 1 may also be quickly conducted to the outer side of the piezoelectric device 1 toward the side away from the piezoelectric sensor 10 through the heat conductive portion 12, in stead of being accumulated in the base 2 to cause heat generated by the piezoelectric sensor 10 to be accumulated, thereby improving a heat dissipation efficiency and a heat dissipation performance of the piezoelectric device 1. After the heat dissipation performance of the piezoelectric device 1 is improved, a working performance and an identification accuracy of the piezoelectric device 1 may be ensured, and power consumption of the piezoelectric device 1 may be reduced.

Figure 11A:
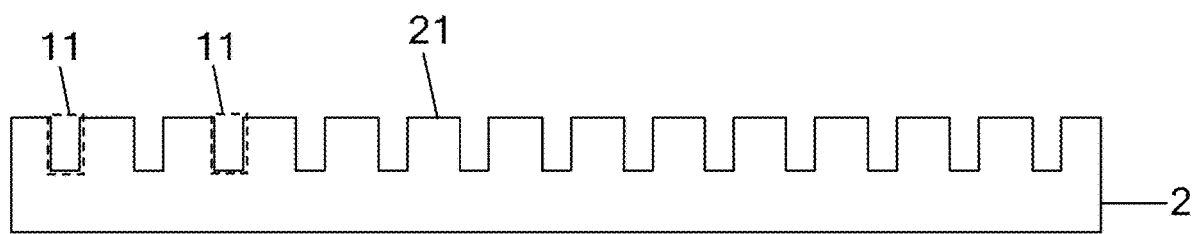
FIG. 11A is a schematic diagram of a base in a piezoelectric device, in accordance with some embodiments.
Figure 11B:
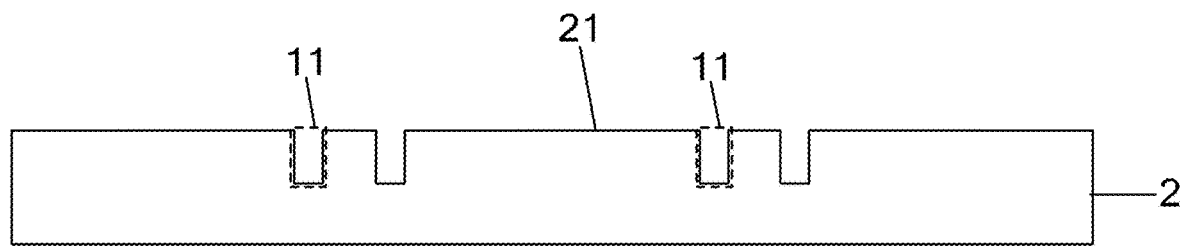
FIG. 11B is a schematic diagram of a base in another piezoelectric device, in accordance with some embodiments.

Optionally, as shown in FIGS. 11A and 11B, S1 includes: forming a plurality of holes 11 in a first surface 21 of the base 2 by the dry etching process, the wet etching process or the laser drilling process. The depth of the holes 11 is less than the thickness of the base 2, that is, the holes 11 do not penetrate the base 2.

Optionally, as shown in FIGS. 1B and 2B, S3 includes: forming a plurality of piezoelectric sensors 10 on a second surface 22 of the base 2. The first surface 21 and the second surface 22 are two opposite surfaces in the thickness direction of the base 2.

In the process of forming the plurality of piezoelectric sensors 10, all first electrodes 101, all piezoelectric patterns 103 and all second electrodes 102 may be separately formed by a single patterning process. For example, a conductive material film may be formed by a magnetron sputtering, and a first patterning process may be performed on the conductive material film to form all first electrodes 101. A piezoelectric material film may be formed by a coating process, and a second patterning process may be performed on the piezoelectric material film to form all piezoelectric patterns 103. Another conductive material film may be formed by a magnetron sputtering, and a third patterning process may be performed on the conductive material film to form all second electrodes 102.

The patterning process may include exposure, development and etching. Mask plates used for exposure in different patterning processes may be the same or different. If patterns formed by different patterning processes are different, the mask plates used are different. If the patterns formed by different patterning processes are the same, the mask plates used are the same.

In some examples, as shown in FIG. 1B, orthographic projections of the piezoelectric sensors 10 on the base 2 have overlapping regions with the holes 11.

In some other examples, as shown in FIG. 2B, the orthographic projections of the piezoelectric sensors 10 on the base 2 do not overlap with any hole 11.

Figure 12A:
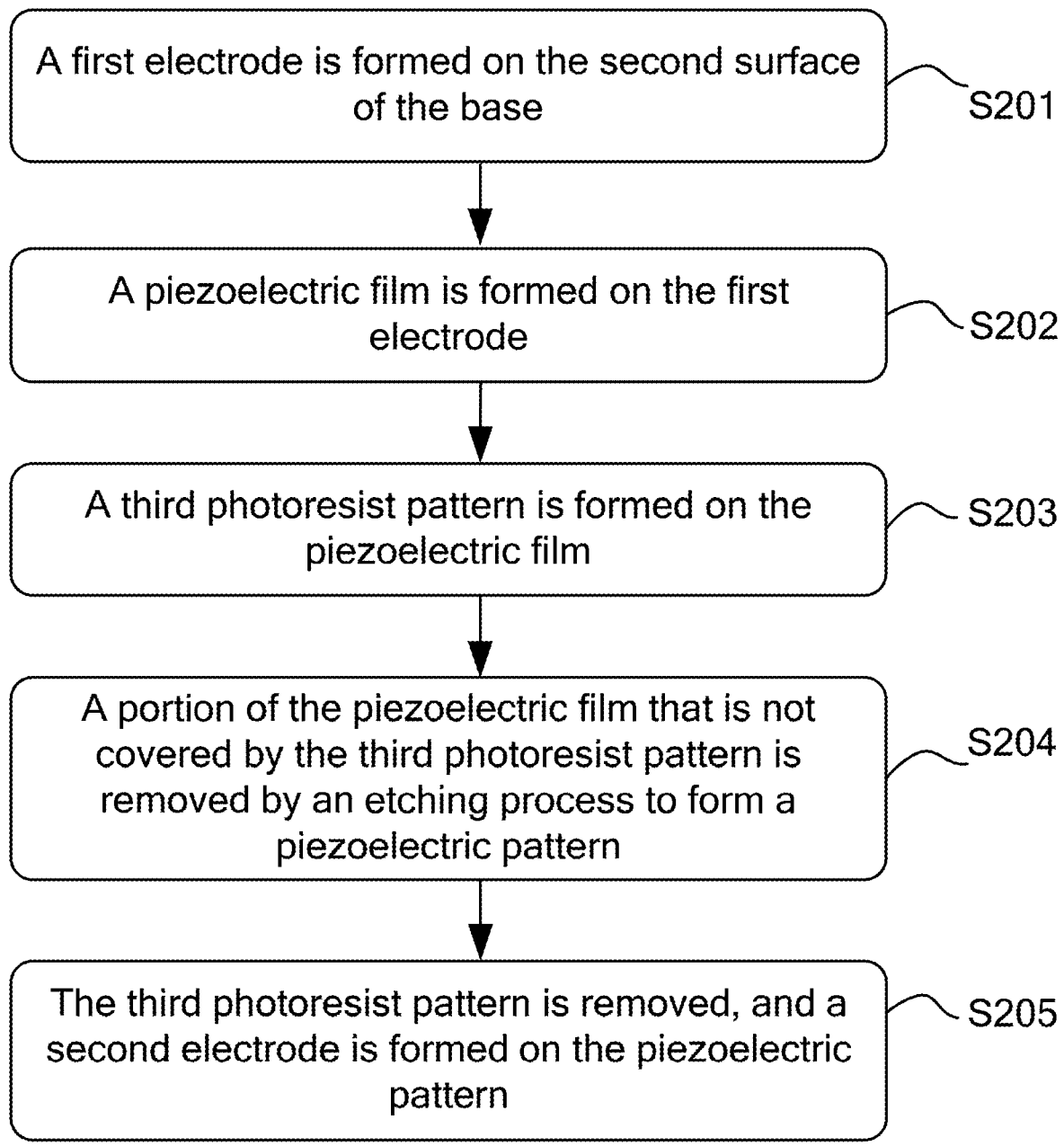
FIG. 12A is a flow diagram of a method for manufacturing a piezoelectric sensor, in accordance with some embodiments.

Optionally, taking one piezoelectric sensor 10 as an example, as shown in FIG. 12A, S3 includes S201 to S205.

Figure 12B:
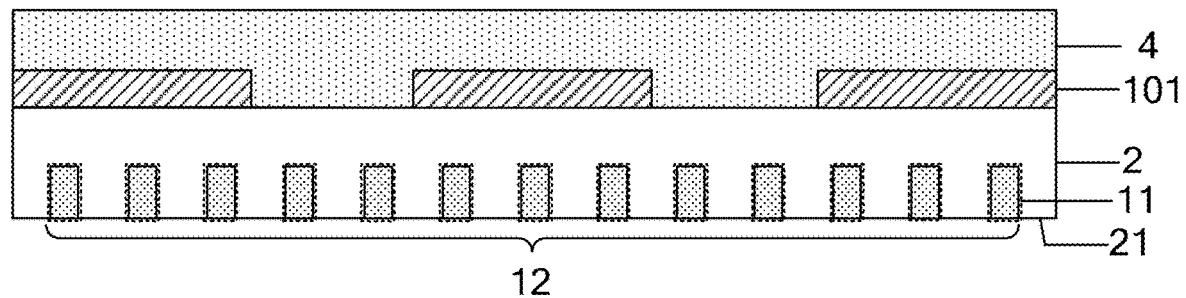
FIGS. 12B to 12F are schematic diagrams showing a process of manufacturing a piezoelectric sensor, in accordance with some embodiments.

In S201, as shown in FIG. 12B, a first electrode 101 is formed on the second surface 22 of the base 2.

For example, a first metal film is formed on the second surface 22 of the base 2 by a magnetron sputtering process, and a first patterning process is performed on the first metal film to form a first electrode 101 in a piezoelectric sensor 101.

In S202, as shown in FIG. 12B, a piezoelectric film 4 is formed on the first electrode 101.

For example, the piezoelectric film 4 is formed on the first electrode 101 by a spin coating process or a slit blade coating process. Then, the piezoelectric film 4 is cured at a low temperature in an environment of 25° C. to 100° C. A curing time is in a range, for example, from 20 minutes to 6 hours. Finally, the piezoelectric film 4 is crystallized at a high temperature in an environment of 130° C. to 150° C. A crystallization time is in a range, for example, from 1 hour to 6 hours.

Figure 12C:
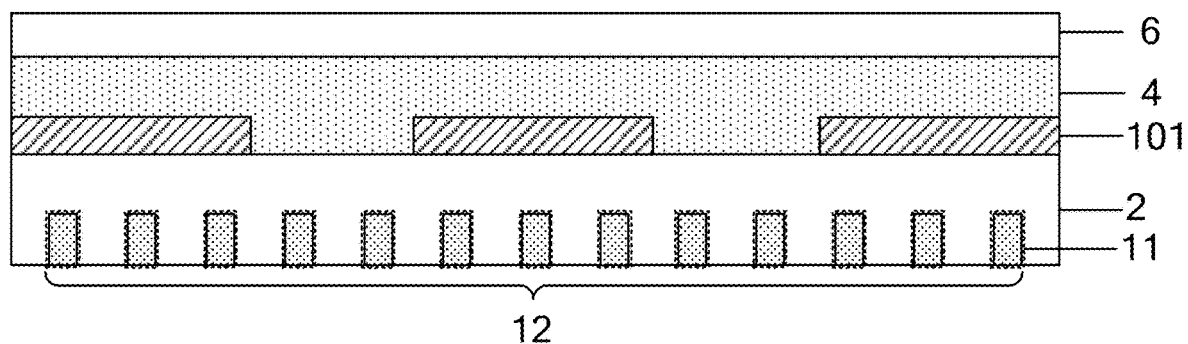
Figure 12D:
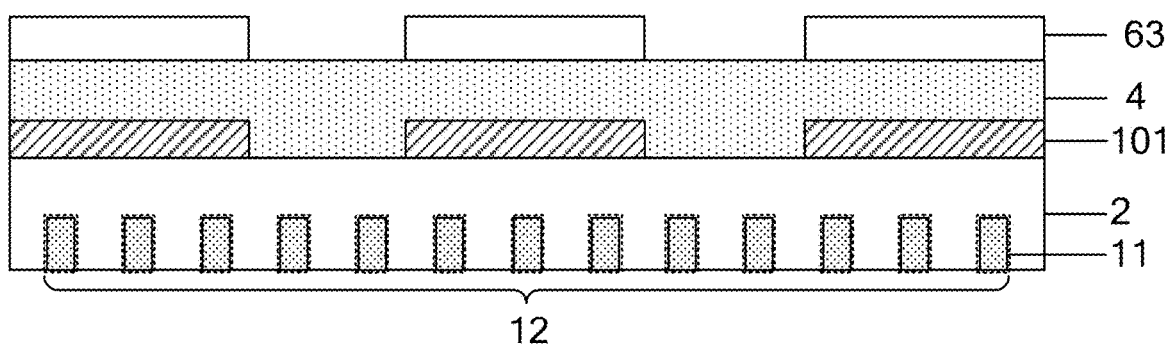

In S203, as shown in FIG. 12D, a third photoresist pattern 63 is formed on the piezoelectric film 4.

For example, as shown in FIG. 12C, a photoresist layer 6 is formed on the piezoelectric film 4, and the photoresist layer 6 is exposed by using a mask plate and developed, so as to form the third photoresist pattern 63 as shown in FIG. 12D.

Figure 12E:
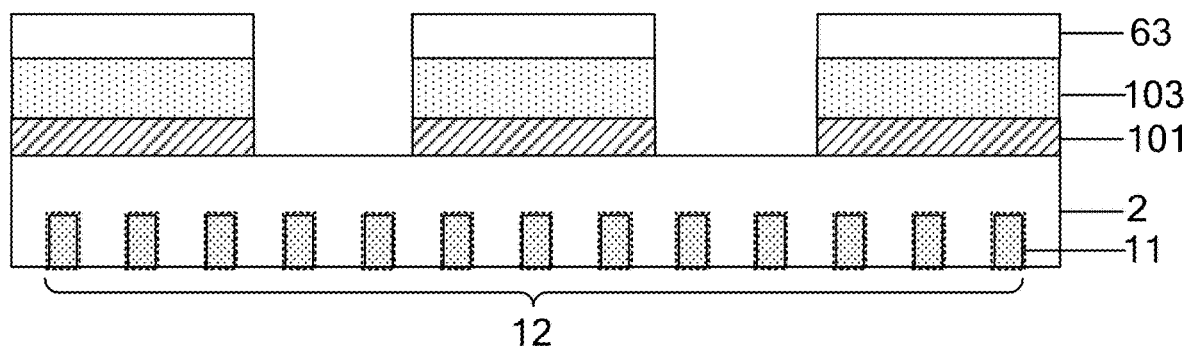

In S204, as shown in FIG. 12E, a portion of the piezoelectric film 4 that is not covered by the third photoresist pattern 63 is removed by an etching process to form a piezoelectric pattern 103.

For example, the portion of the piezoelectric film 4 that is not covered by the third photoresist pattern 63 is removed by the dry etching process.

In the dry etching process, the piezoelectric film 4 may be etched by using a reactive ion etching process or a plasma etching process. A gas used in the reactive ion etching process or the plasma etching process need to be selected from gases that have no etching effect on the photoresist and only have an etching effect on the piezoelectric film 4, thereby ensuring integrity of the formed third photoresist pattern 63, and further ensuring that a shape of the etched piezoelectric pattern 103 conforms to an expected design.

Figure 12F:
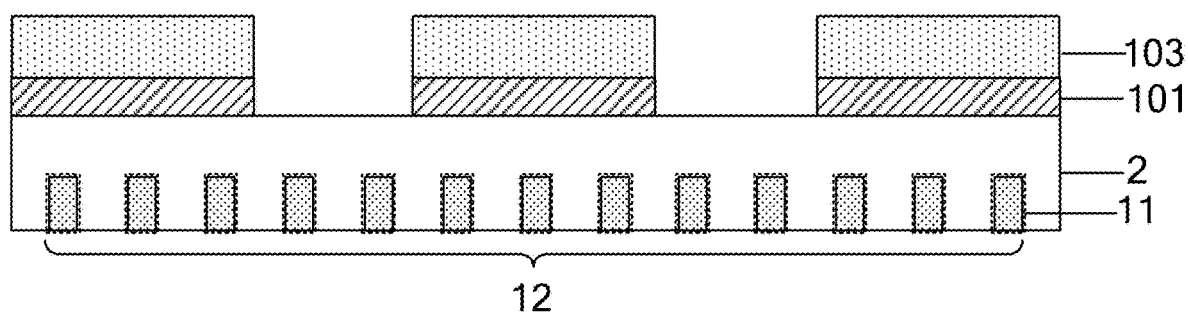

In S205, as shown in FIG. 12F, the third photoresist pattern 63 is removed, and as shown in FIG. 1B, a second electrode 102 is formed on the piezoelectric pattern 103.

For example, the third photoresist pattern 63 is removed by using the etching process. After the third photoresist pattern 63 is removed, a second metal film is formed on the base 2 on which a plurality of piezoelectric patterns 103 are formed by using the magnetron sputtering process, and a third patterning process is performed on the second metal film to form the second electrode 102.

It will be noted that, in the above embodiments, a process of forming the piezoelectric device 1 is described by taking one piezoelectric sensor 10 as an example. However, in order to clearly show the process of forming the whole piezoelectric device 1, FIGS. 12B to 12F show a plurality of piezoelectric sensors 10.

Figure 13A:
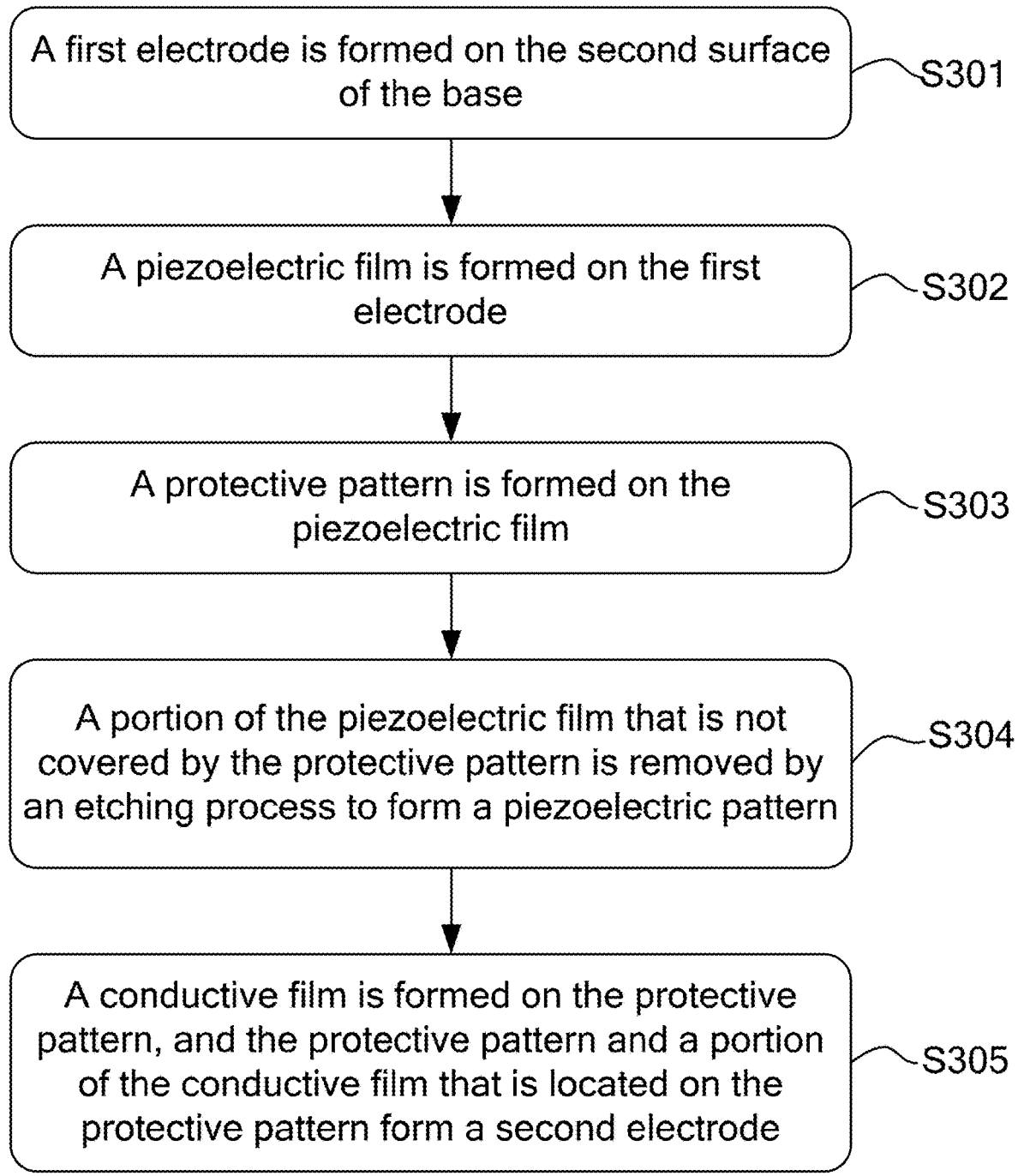
FIG. 13A is a flow diagram of a method for manufacturing another piezoelectric sensor, in accordance with some embodiments.

Optionally, taking one piezoelectric sensor 10 as an example, as shown in FIG. 13A, S3 includes S301 to S305.

In S301, as shown in FIG. 12B, a first electrode 101 is formed on the second surface 22 of the base 2.

As for a manner in which the first electrode 101 is formed, reference may be made to S201 in the above embodiments.

In S302, as shown in FIG. 12B, a piezoelectric film 4 is formed on the first electrode 101.

As for a manner in which the piezoelectric film 4 is formed, reference may be made to S202 in the above embodiments.

Figure 13B:
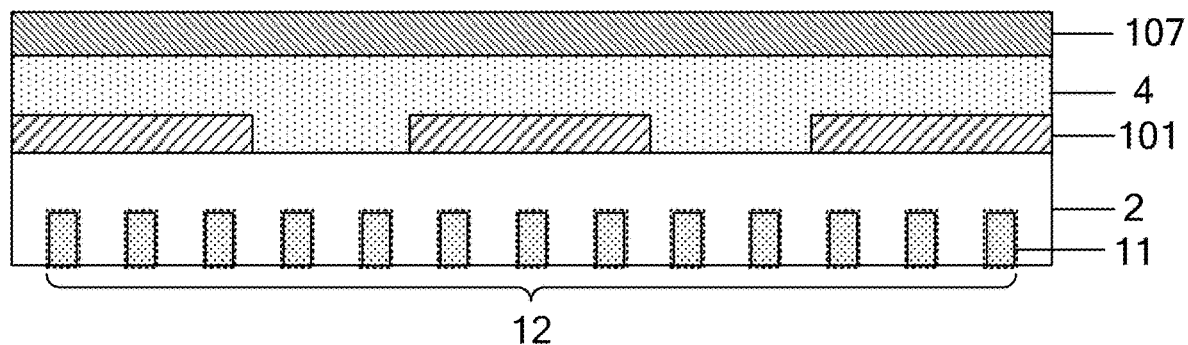
FIGS. 13B to 13I are schematic diagrams showing a process of manufacturing another piezoelectric sensor, in accordance with some embodiments.
Figure 13C:
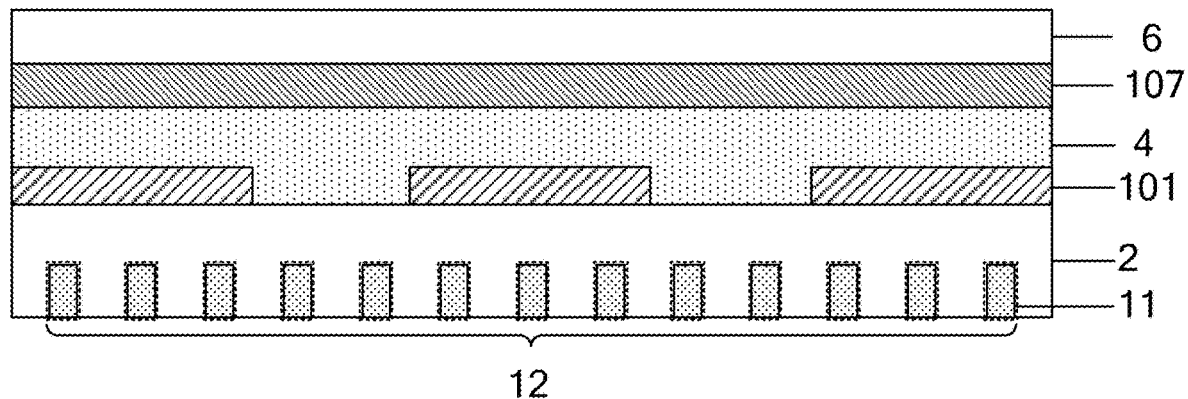
Figure 13D:
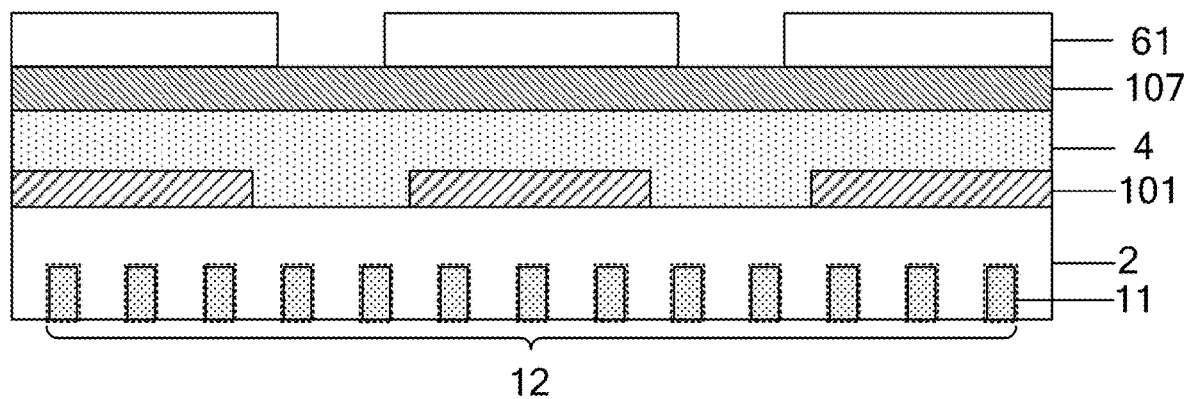
Figure 13E:
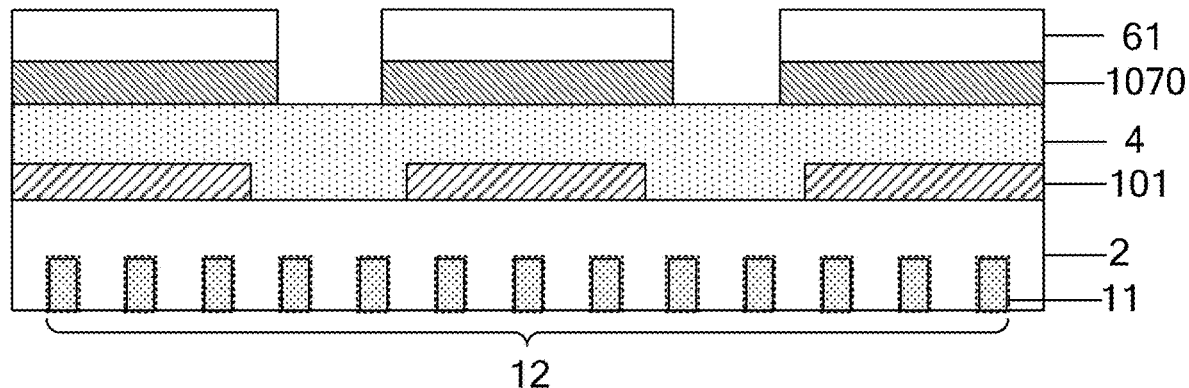

In S303, as shown in FIG. 13E, a protective pattern 1070 is formed on the piezoelectric film 4, and a material of the protective pattern 1070 is a conductive material.

For example, the conductive material includes a metal or a transparent conductive oxide. The metal is, for example, Ag, Al, titanium (Ti) or molybdenum (Mo). The transparent conductive oxide is, for example, indium tin oxide (ITO), indium zinc oxide (IZO), indium gallium zinc oxide (IGZO). Optionally, the protective pattern 1070 is made of Ag.

A process of forming the protective pattern 1070 on the piezoelectric film 4 is as follows.

Figure 13F:
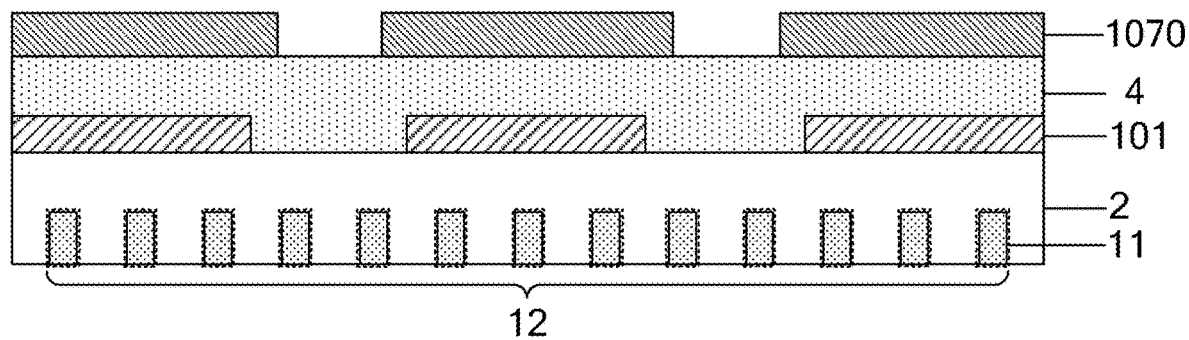

Firstly, as shown in FIG. 13B, a first conductive layer 107 is formed on the piezoelectric film 4 by using a screen printing process, the magnetron sputtering process, or the evaporation process. Secondly, as shown in FIG. 13C, a photoresist layer 6 is formed on the first conductive layer 107. Thirdly, as shown in FIG. 13D, the photoresist layer 6 is patterned to form a first photoresist pattern 61, the patterning process herein includes exposing the photoresist layer 6 to, for example, ultraviolet light, by using a mask plate, and developing the exposed photoresist layer 6 to transfer a pattern of the mask plate to the photoresist layer 6. Fourthly, as shown in FIG. 13E, the first conductive layer 107 is etched by using the first photoresist pattern 61 as a mask, that is, a region in the first conductive layer 107 that is not covered by the first photoresist pattern 61 is etched, so as to form a protective pattern 1070, and an edge of an orthographic projection of the protective pattern 1070 on the base 2 is located outside an edge of an orthographic projection of the first electrode 101 on the base 2. Finally, the first photoresist pattern 61 is removed, that is, a structure as shown in FIG. 13F is formed.

It will be noted that, in the above process, the protective pattern 1070 is formed by using an ultraviolet lithography process, but the protective pattern 1070 may also be formed by using other processes, such as an electron beam lithography process or a laser direct writing process, which is not limited in the embodiments of the present disclosure.

Figure 13G:
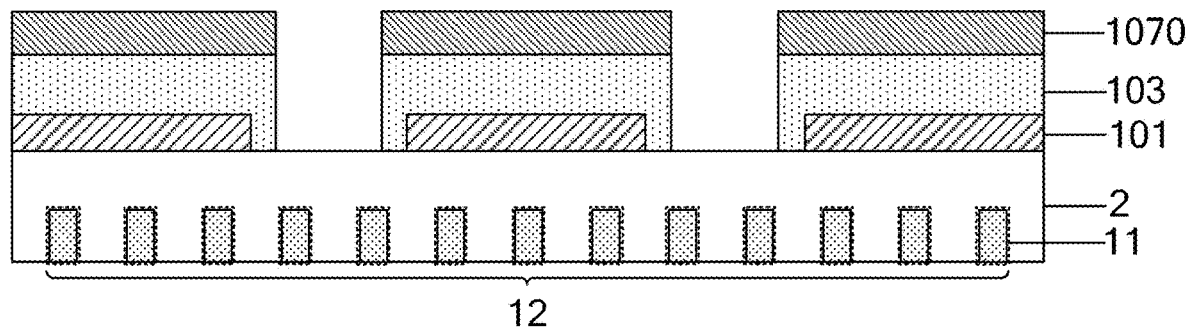

In S304, as shown in FIG. 13G, a portion of the piezoelectric film 4 that is not covered by the protective pattern 1070 is removed by the etching process to form a piezoelectric pattern 103.

In this process, the piezoelectric film 4 needs to be etched by using the protective pattern 1070 as a mask. The etching process may be the dry etching process, such as the reactive ion etching process or the plasma etching process, and a gas used in the etching process needs to be selected from gases that only have an etching effect on the piezoelectric film 4 and have no or very little etching effect on the protective pattern 1070. For example, the gas is oxygen ($O_2$), a mixture of $O_2$ and argon (Ar), or a mixture of $O_2$ and helium (He).

It will be noted that, the gas that may be selected in the dry etching process is not limited to the gases listed above. The etching gas needs to be selected according to materials of films. During the selection, a principle that is followed is to select gases that have a high etching selectivity for the relevant films in the etching process.

For example, $O_2$ has a high etching rate for the piezoelectric film 4, but does not have an etching effect on or has a very low etching rate for the protective pattern 1070, which will not affect integrity of the piezoelectric pattern 103 formed according to the protective pattern 1070. Therefore, $O_2$ is a gas having a high etching selectivity for the piezoelectric pattern 103.

Figure 17:
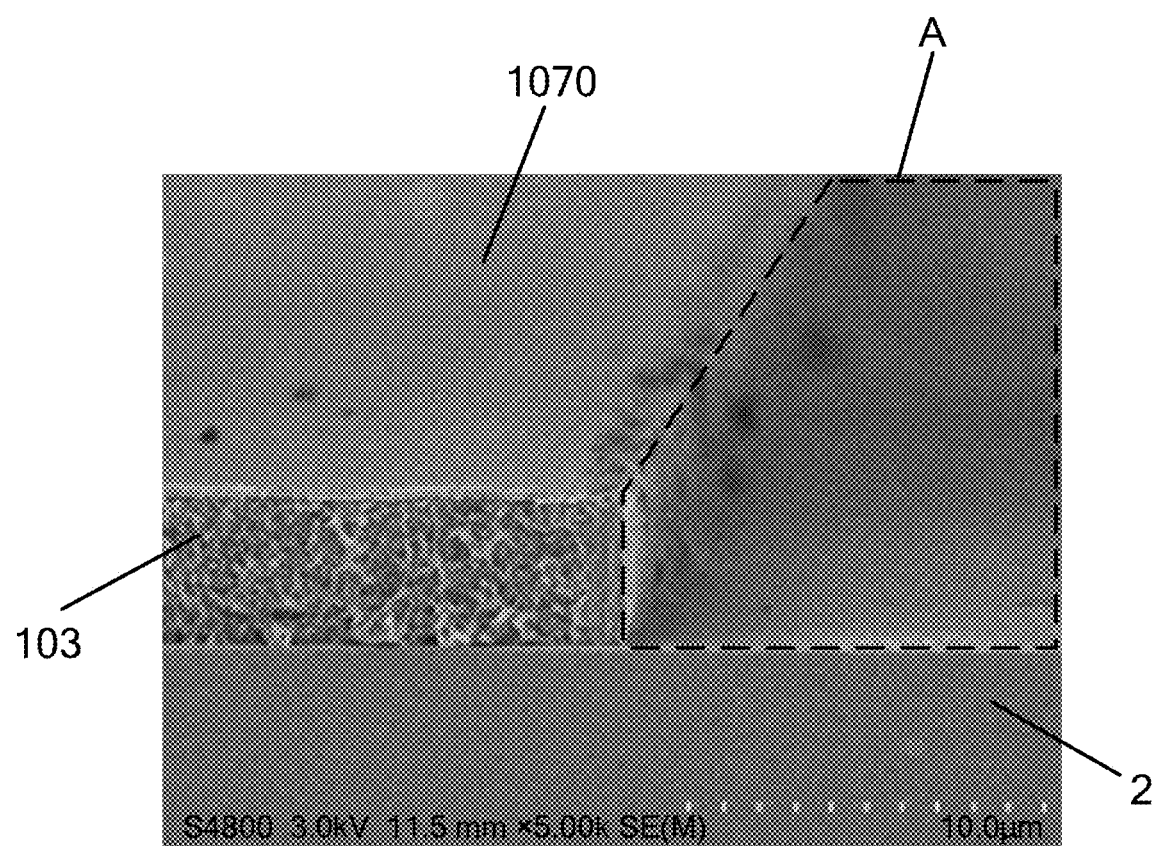
FIG. 17 is a scanning electron microscope (SEM) photograph of a piezoelectric pattern, in accordance with some embodiments.

For example, the piezoelectric film 4 is made of PVDF, and the protective pattern 1070 is made of any of Ag, Al, Ti, or Mo. The protective pattern 1070 is used as a mask, and a sectional view of the piezoelectric pattern 103 formed by etching the piezoelectric film 4 is shown in FIG. 17. It will be seen from FIG. 17 that, the gas used in the dry etching process, such as $O_2$, can remove a portion of the piezoelectric film that is not covered by the protective pattern 1070 (as shown by the dashed frame A in FIG. 17), and has no etching effect on the protective pattern 1070.

Figure 13H:
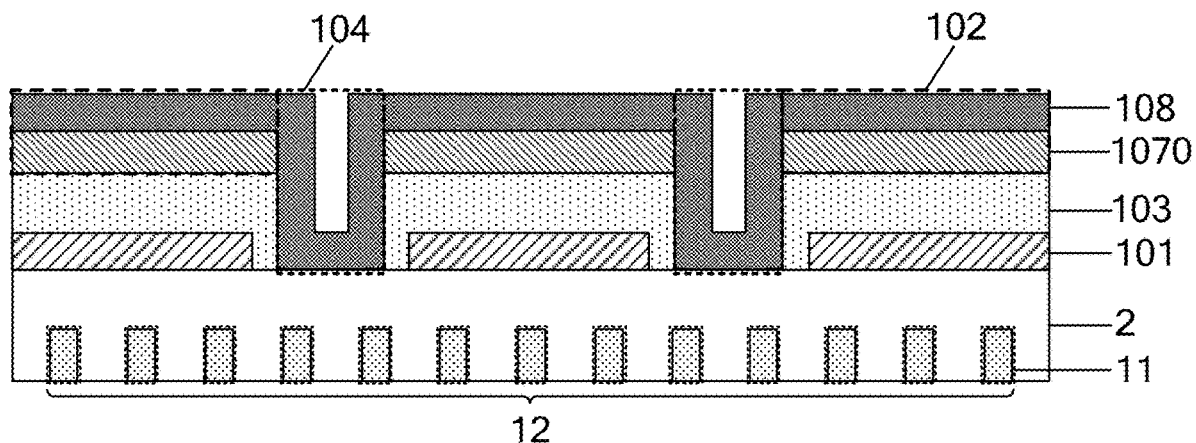

In S305, as shown in FIG. 13H, a conductive film 108 is formed on the protective pattern 1070. The protective pattern 1070 and a portion of the conductive film 108 that is located on the protective pattern 1070 form a second electrode 102.

For example, the conductive film 108 is formed on the protective pattern 1070 by using a sputtering process or the evaporation process. The conductive film 108 is made of, for example, a conductive metal material or a transparent conductive oxide.

It will be noted that, in the above embodiments, a process of forming the piezoelectric device 1 is described by taking one piezoelectric sensor 10 as an example. However, in order to clearly show the process of forming the whole piezoelectric device 1, FIGS. 13B to 13I show a plurality of piezoelectric sensors 10 in the piezoelectric device 1.

In a case where a plurality of piezoelectric sensors 10 are formed, as shown in FIG. 13H, the conductive film 108 has a whole-layer structure and is located on protective patterns 1070 of all piezoelectric sensors 10. A portion of the conductive film 108 that is located between protective patterns 1070 of adjacent piezoelectric sensors 10 is a connecting electrode 104. The connecting electrode 104 may electrically connect second electrodes 102 of the adjacent piezoelectric sensors 10. The whole conductive film 108 covers all protective patterns 1070, and the protective patterns 1070 are made of the conductive material. Therefore, the protective patterns 1070 and the conductive film 108 are electrically connected to each other, and all second electrodes 102 are also electrically connected to each other.

In each piezoelectric sensor 10, since the first electrode 101 and the second electrode 102 need to be insulated from each other, the first electrode 101 may be wrapped inside the piezoelectric pattern 103 during forming the piezoelectric pattern 103. By taking an example in which the piezoelectric sensor 10 includes one first electrode 101, a size of the piezoelectric pattern 103 is greater than a size of the first electrode 101, thereby forming the piezoelectric pattern 103 and the first electrode 101 shown in FIG. 13H.

Figure 13I:
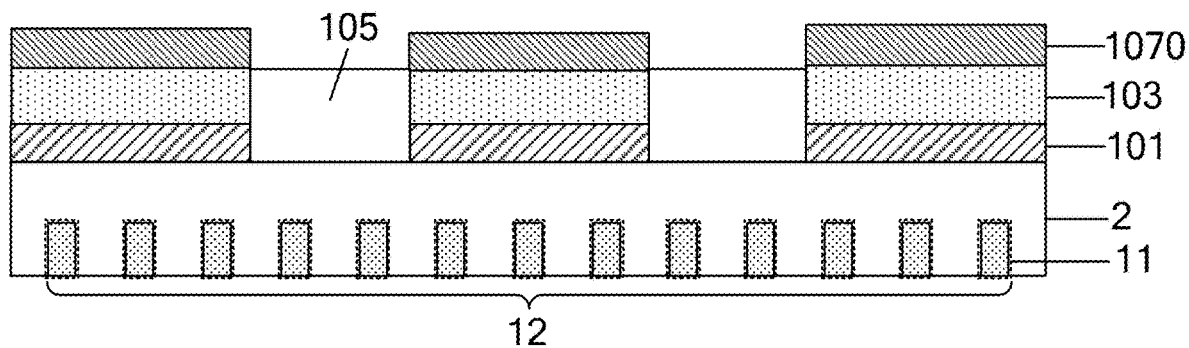

Of course, an insulating layer 105 may be formed before the conductive film 108 is formed. For example, in the case where a plurality of piezoelectric sensors 10 are formed, as shown in FIG. 13I, the insulating layer 105 is formed between adjacent piezoelectric patterns 103. Or, the insulating layer 105 is formed between adjacent first electrodes 101. Or, the insulating layer 105 is formed between adjacent protective patterns 1070.

The material protective pattern 1070 and the conductive film 108 may be made of the same material or different materials. For example, in a case where the protective pattern 1070 and the conductive film 108 are both made of Ag, since they are made of the same material, a contact interface between the protective pattern 1070 and the conductive film 108 may not be clearly observed in a sectional diagram as shown in FIG. 13H. For another example, in a case where one of the protective pattern 1070 and the conductive film 108 is made of Ag, and the other of the protective pattern 1070 and the conductive film 108 is made of Al, the contact interface between the protective pattern 1070 and the conductive film 108 may be clearly observed in the sectional diagram as shown in FIG. 13H.

It will be noted that, in FIG. 13H, in order to clearly show structures and positions of the protective pattern 1070 and the conductive film 108, the materials of the protective pattern 1070 and the conductive film 108 are distinguished, so that the contact interface between the protective pattern 1070 and the conductive film 108 may be clearly observed in FIG. 13H. However, whether the materials of the protective pattern 1070 and the conductive film 108 are actually the same or not is not limited.

On a basis of the piezoelectric sensor 10 formed in S301 to S305, the piezoelectric film 4 is etched by using the protective pattern 1070 as a mask, so that there are a plurality of gases that may be selected in the etching process, and a difficulty in etching the piezoelectric film 4 is reduced. Moreover, all second electrodes 102 are electrically connected together, which is conductive to reducing a difficulty in wiring of the piezoelectric device 1, thereby improving a product yield.

Optionally, taking one piezoelectric sensor 10 as an example, S3 includes S401 to S405.

In S401, as shown in FIG. 12B, a first electrode 101 is formed on the second surface 22 of the base 2.

As for a manner in which the first electrode 101 is formed, reference may be made to S201 in the above embodiment.

In S402, as shown in FIG. 12B, a piezoelectric film 4 is formed on the first electrode 101.

Figure 14A:
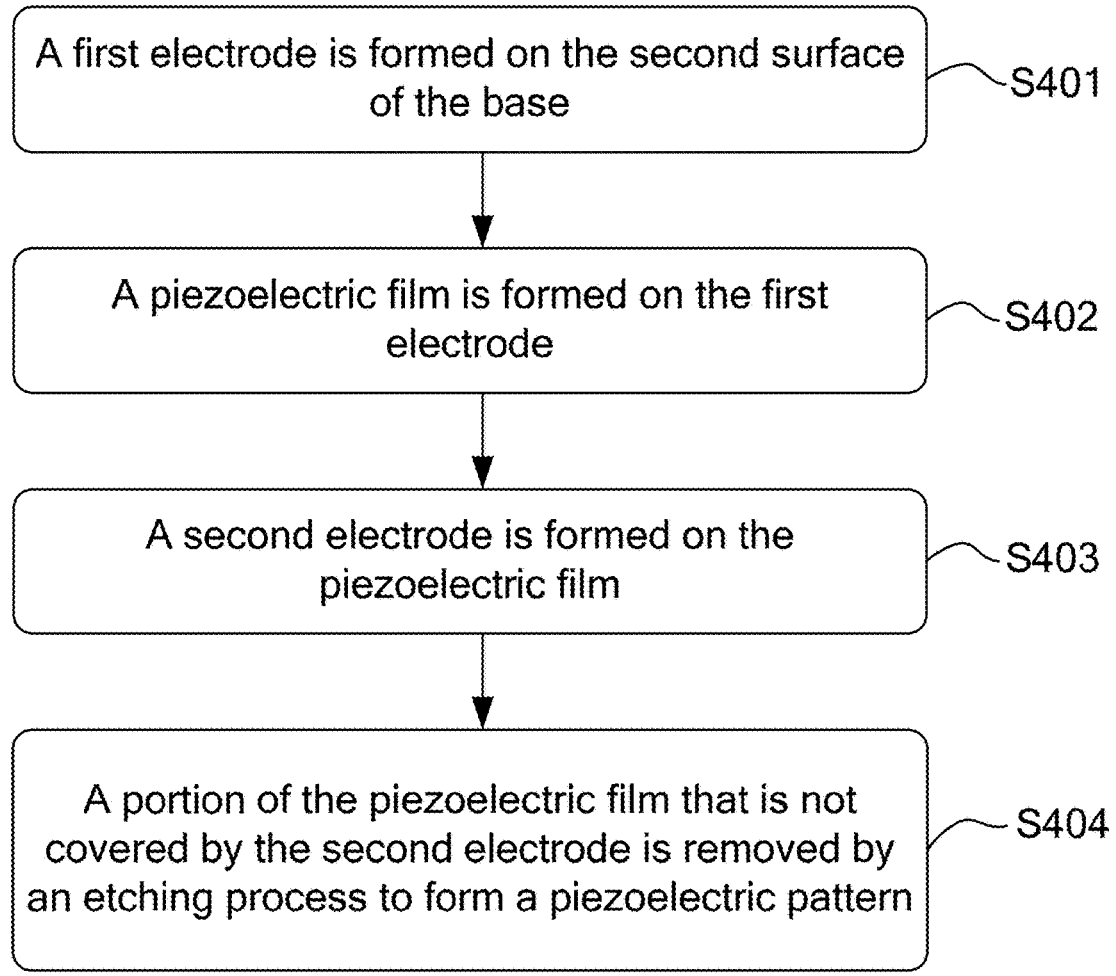
FIG. 14A is a flow diagram of a method for manufacturing yet another piezoelectric sensor, in accordance with some embodiments.
Figure 14B:
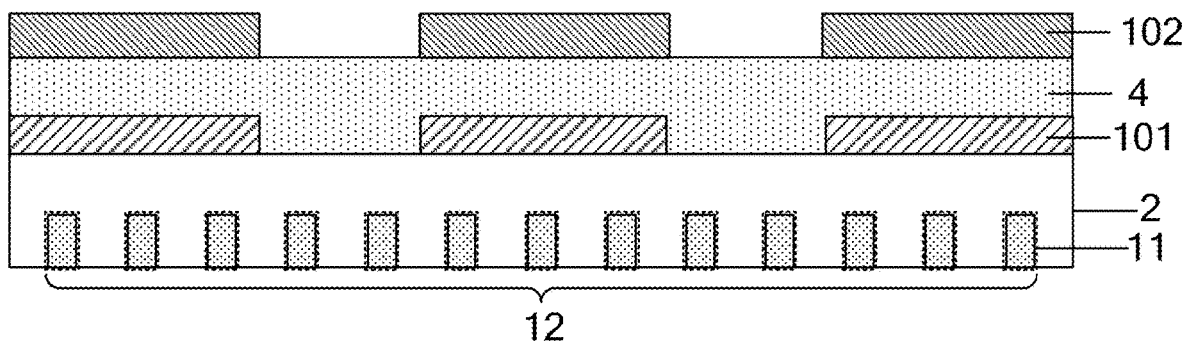
FIG. 14B is a schematic diagram showing a process of manufacturing yet another piezoelectric sensor, in accordance with some embodiments.

In S403, as shown in FIG. 14B, a second electrode 102 is formed on the piezoelectric film 4.

For example, a second metal film is formed on the piezoelectric film 4 by using the screen printing process, the magnetron sputtering process or the evaporation process, and a third patterning process, similar to that in S205, is performed on the second metal film to form the second electrode 102.

A process of forming the second electrode 102 on the piezoelectric film 4 is as follows.

Figure 15A:
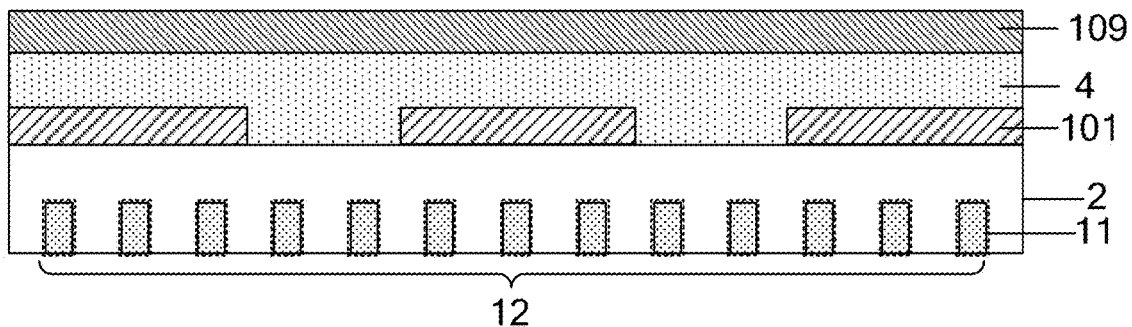
FIGS. 15A to 15E are schematic diagrams showing a process of forming a second electrode in a piezoelectric sensor, in accordance with some embodiments.
Figure 15B:
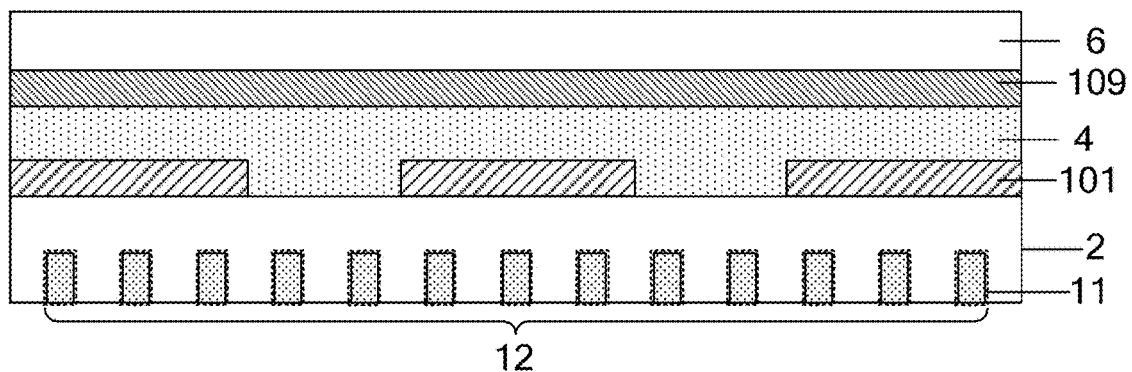
Figure 15C:
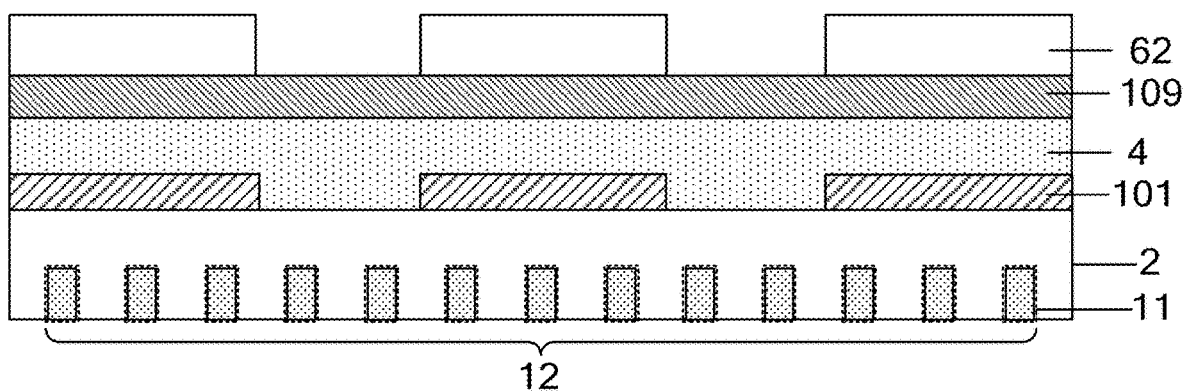
Figure 15D:
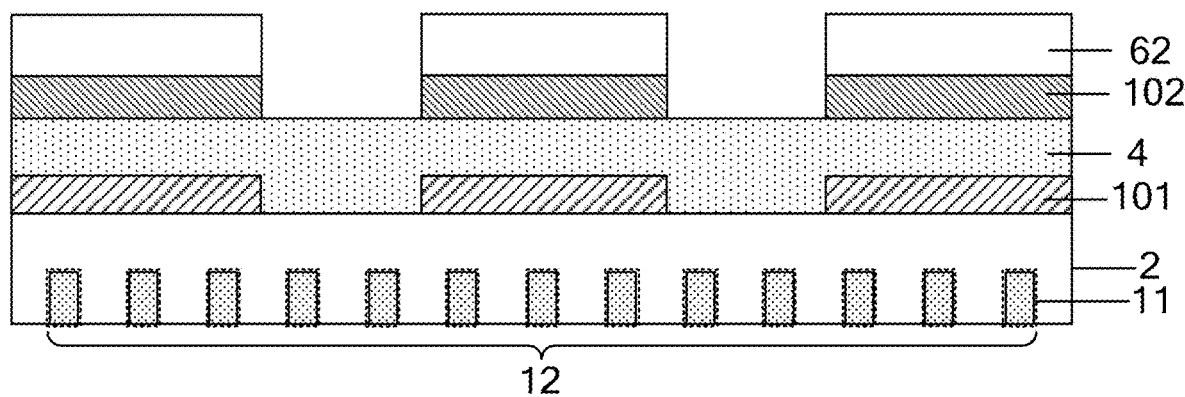
Figure 15E:
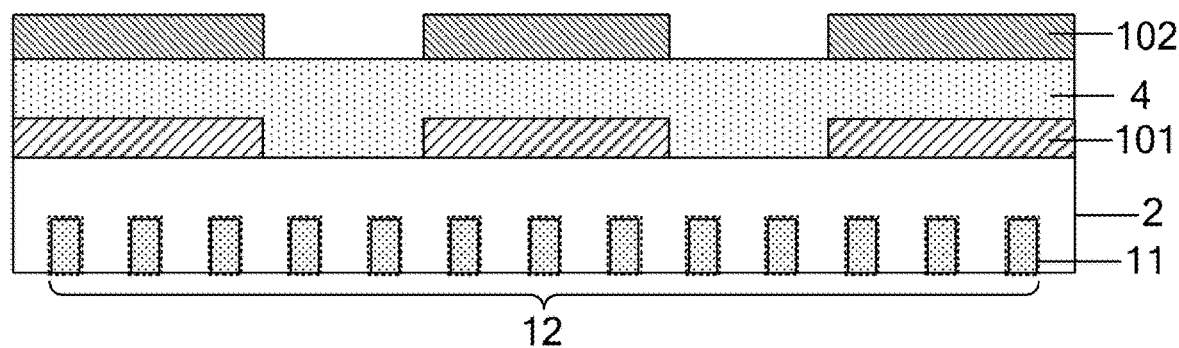

Firstly, as shown in FIG. 15A, a second conductive layer 109 is formed on the piezoelectric film 4 by using the screen printing process, the magnetron sputtering process, or the evaporation process. Secondly, as shown in FIG. 15B, a photoresist layer 6 is formed on the second conductive layer 109. Thirdly, as shown in FIG. 15C, the photoresist layer 6 is patterned to form a second photoresist pattern 62, and the patterning process herein includes exposing the photoresist layer 6 by using a mask plate, and developing the exposed photoresist layer 6 to transfer a pattern of the mask plate to the photoresist layer 6. Fourthly, as shown in FIG. 15D, the second conductive layer 109 is etched by using the second photoresist pattern 62 as a mask, that is, a region in the second conductive layer 109 that is not covered by the second photoresist pattern 62 is etched to form a second electrode 102. Finally, the second photoresist pattern 62 on the second electrode 102 is removed, that is, a structure as shown in FIG. 15E is formed. The second photoresist pattern 62 may be removed by using, for example, an ashing process.

In above process, the etching process may be the dry etching process. In the dry etching process, since gas is used for etching, an etching accuracy is higher than an etching accuracy of the wet etching process, so that the included angle between the sidewall of the piezoelectric pattern 103 and the base 2 is close to a right angle, thereby facilitating to reduce a spacing between two adjacent piezoelectric patterns 103. In a case where the base 2 has a same size, the smaller the spacing between the piezoelectric patterns 103 is, the greater the number of the piezoelectric patterns 103 is, thereby facilitating to improve a measurement accuracy of the piezoelectric device 1.

In S404, a portion of the piezoelectric film 4 that is not covered by the second electrode 102 is removed by the etching process to form a piezoelectric pattern 103 as shown in FIG. 1B.

In S404, the piezoelectric film 4 is directly etched by using the second electrode 102 as a mask, and a manufacturing process is simple. That is, in a case where the protective pattern 1070 is made of the conductive material, the protective pattern 1070 may directly serve as the second electrode 102. Therefore, the manufacturing process may be simplified, and a manufacturing efficiency of the piezoelectric device 1 may be improved.

It will be noted that, in the above embodiments, a process of forming the piezoelectric device 1 is described by taking one piezoelectric sensor 10 as an example. However, in order to clearly show the process of forming the whole piezoelectric device 1, FIGS. 14B to 15D show a plurality of piezoelectric sensors 10 in the piezoelectric device 1.

On a basis of the piezoelectric sensor 10 formed in S401 to S404, the manufacturing process is relatively simple, the manufacturing efficiency is relatively high, and the piezoelectric device 1 may be made light and thin.

Figure 16A:
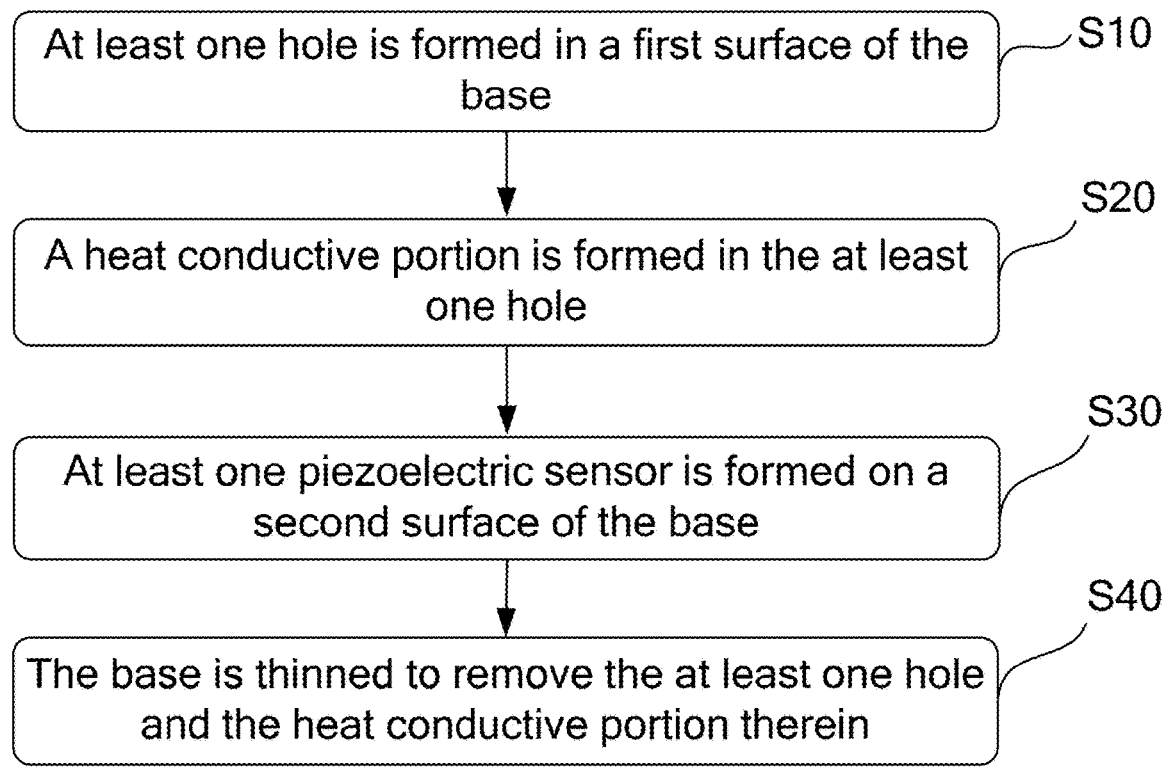
FIG. 16A is a flow diagram of a method for manufacturing another piezoelectric sensor, in accordance with some embodiments.

Some embodiments of the present disclosure provide a method for manufacturing another piezoelectric device 1. As shown in FIG. 16A, the method includes S10 to S40.

In S10, as shown in FIG. 10B, at least one hole 11 is formed on a first surface 21 of a base 2.

For example, the base 2 is a glass base, and a thickness of the glass base is in a range from approximately 0.4 mm to approximately 0.5 mm.

The at least one hole 11 may be formed in the first surface 21 of the base 2 by a dry etching process, a wet etching process, or a laser drilling process.

In S20, as shown in FIG. 10C, a heat conductive portion 12 is formed in the at least one hole 11. A thermal conductivity of the heat conductive portion 12 is greater than a thermal conductivity of the base 2.

The heat conductive portion 12 is made of silver (Ag), aluminum (Al) or copper (Cu). A thermal conductivity of Ag is approximately 429 W/mK, a thermal conductivity of Al is approximately 237 W/mK, and a thermal conductivity of Cu is approximately 400 W/mK.

For example, S20 includes: filling the at least one hole 11 with a heat conductive material by an evaporation process, an electroplating process or a coating process to form the heat conductive portion 12.

In S30, as shown in FIG. 1E, at least one piezoelectric sensor 10 is formed on a second surface 22 of the base 2. Each piezoelectric sensor 10 includes at least one first electrode 101, a piezoelectric pattern 103 and a second electrode 102 that are sequentially formed on the base 2.

The piezoelectric pattern 103 is made of a piezoelectric material, and the piezoelectric material may be polyvinylidene fluoride (PVDF), poly vinyledene fluoride-trifluoroethylene (PVDF-TrFE), or polytetrafluoroethylene (PTFE).

As for a process of manufacturing the piezoelectric sensor 10, reference may be made to the description in the foregoing embodiments, which will not be repeated herein.

Figure 16B:
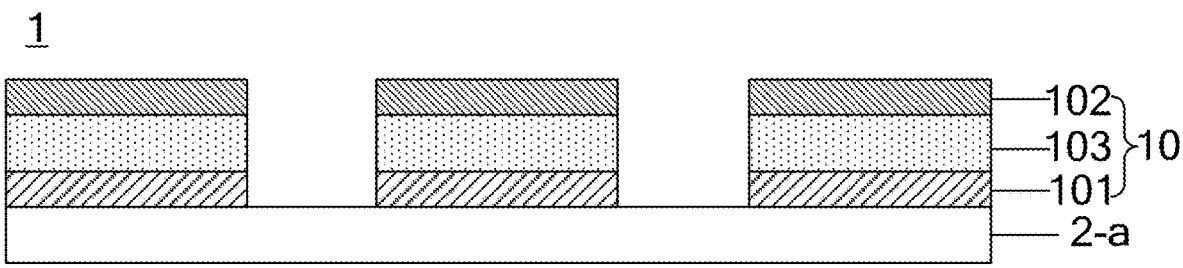
FIG. 16B is a schematic diagram of yet another piezoelectric device, in accordance with some embodiments.

In S40, the base 2 is thinned to remove the at least one hole 11 and the heat conductive portion 12 therein, so that a thinned base 2-a is obtained as shown in FIG. 16B.

For example, after the glass base is thinned, a remaining thickness of the base 2 is approximately 0.1 mm.

In the process of thinning the base 2, for example, hydrofluoric acid (HF) may be used to etch the base 2 to achieve thinning, or the base 2 may be thinned by means of mechanical grinding. By thinning the base 2, a thickness of the piezoelectric device 1 may be reduced, which is conducive to making the piezoelectric device 1 light and thin.

As for details of the method for manufacturing the piezoelectric device 1, reference may be made to contents of the above method for manufacturing the piezoelectric device 1, which will not be repeated herein.

Some embodiments of the present disclosure provide a piezoelectric device 1 that is manufactured by using the above manufacturing method in S10 to S40. The piezoelectric device 1 includes a base 2-a and the at least one piezoelectric sensor 10 disposed on the base 2-a.

It will be noted that, after the piezoelectric sensor 10 is formed, the base 2, provided with the hole 11 and the heat conductive portion 12 therein, provided in the foregoing embodiments is thinned to remove the hole 11 and the heat conductive portion 12, so that the base 2-a may be obtained. That is, the thickness of the base 2-a is less than that of the base 2.

In addition to having the same beneficial effects as the piezoelectric device 1 in the above embodiments, the piezoelectric device 1 also has an advantage of being light and thin.

Figure 8C:
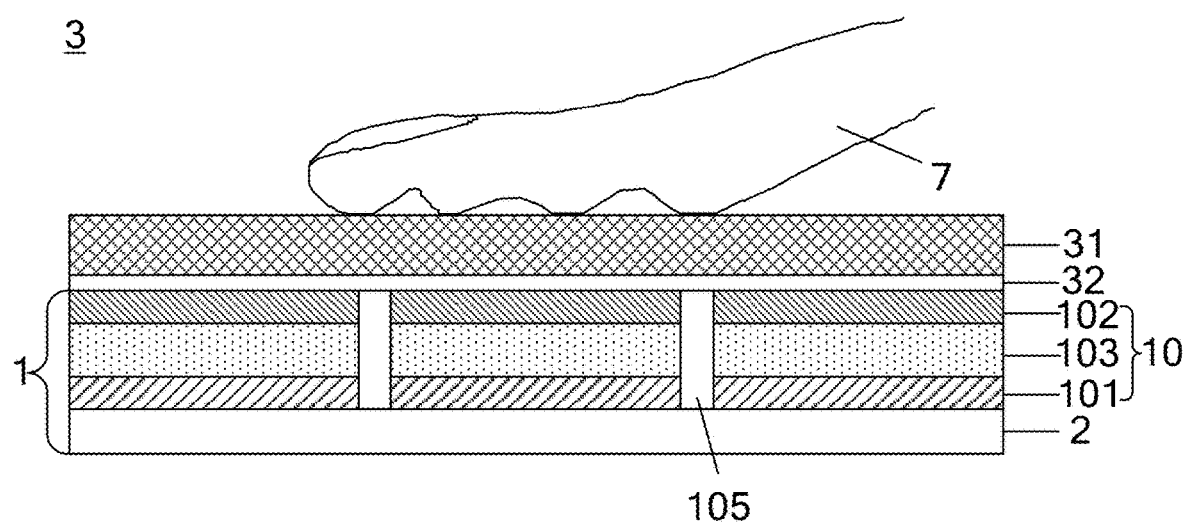
FIG. 8C is a schematic diagram of yet another display apparatus, in accordance with some embodiments.

Some embodiments of the present disclosure provide a display apparatus 3 including a display panel 31 and a piezoelectric device 1. As shown in FIG. 8C, the piezoelectric device 1 is the piezoelectric device 1 manufactured by using the manufacturing method in S10 to S40.

As for an arrangement relationship between the piezoelectric device 1 and the display panel 31, reference may be made to the embodiments of the display apparatus corresponding to FIGS. 8A and 8B, which will not be repeated herein.

The foregoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A piezoelectric device, comprising:
   a base having at least one hole;
   a heat conductive portion disposed in the at least one hole and in contact with a wall of the at least one hole; wherein a thermal conductivity of the heat conductive portion is greater than a thermal conductivity of the base; and
   at least one piezoelectric sensor disposed on the base; wherein each piezoelectric sensor includes: a first electrode, a piezoelectric pattern made of a piezoelectric material and a second electrode that are sequentially stacked in a thickness direction of the base, wherein
   the at least one hole includes a plurality of holes spaced apart from each other;
   the at least one piezoelectric sensor includes a plurality of piezoelectric sensors that are arranged in an array and spaced apart from each other; and
   some holes of the plurality of holes are disposed in regions, facing the plurality of piezoelectric sensors, of the base, and remaining holes of the plurality of holes are disposed in regions, between the plurality of piezoelectric sensors, of the base; and an orthographic projection of each piezoelectric sensor on the base overlaps with at least one of the plurality of holes.

2. The piezoelectric device according to claim 1, wherein a depth of each hole is less than a thickness of the base in the thickness direction of the base.

3. The piezoelectric device according to claim 2, wherein the base further has a first surface and a second surface that are opposite to each other in the thickness direction of the base; and
   the plurality of holes are disposed in the first surface, and the plurality of piezoelectric sensors are disposed on the second surface.

4. The piezoelectric device according to claim 1, wherein a thickness of the heat conductive portion is equal to a depth of the plurality of holes in the thickness direction of the base.

5. The piezoelectric device according to claim 1, wherein the thermal conductivity of the heat conductive portion is in a range from approximately 120 W/mK to approximately 450 W/mK.

6. The piezoelectric device according to claim 1, wherein the heat conductive portion includes a plurality of heat conductive blocks spaced apart from each other, each heat conductive block being disposed in a respective one of the plurality of holes.

7. The piezoelectric device according to claim 1, further comprising at least one connecting electrode; wherein
   second electrodes in all piezoelectric sensors are electrically connected by the at least one connecting electrode.

8. The piezoelectric device according to claim 1, wherein a size of the at least one piezoelectric pattern is in an order of micrometers or nanometers.

9. A display apparatus, comprising:
   a display panel, and
   the piezoelectric device according to claim 1, disposed on a side of the display panel.

10. The display apparatus according to claim 9, wherein the display panel includes a plurality of sub-pixels; and
    an orthographic projection of one piezoelectric sensor in the piezoelectric device on the display panel has an overlapping region with M sub-pixels in the plurality of sub-pixels, M being an integer greater than zero and less than four.

11. The display apparatus according to claim 10, wherein an orthographic projection of a first electrode of the piezoelectric sensor on the display panel completely overlaps with one of the M sub-pixels; and
    an orthographic projection of a piezoelectric pattern of the piezoelectric sensor on the display panel has an overlapping region with the M sub-pixels.

12. A method for manufacturing the piezoelectric device according to claim 1, the method comprising:
    forming the base having the at least one hole;
    forming the heat conductive portion in the at least one hole; wherein the heat conductive portion is in contact with the wall of the at least one hole, and the thermal conductivity of the heat conductive portion is greater than the thermal conductivity of the base; and
    forming the at least one piezoelectric sensor on the base; wherein each piezoelectric sensor includes the first electrode, the piezoelectric pattern made of the piezoelectric material and the second electrode that are sequentially formed on the base, wherein
    the at least one hole includes the plurality of holes spaced apart from each other; the at least one piezoelectric sensor includes the plurality of piezoelectric sensors that are arranged in an array and spaced apart from each other; the some holes of the plurality of holes are disposed in the regions, facing the plurality of piezoelectric sensors, of the base, and the remaining holes of the plurality of holes are disposed in the regions, between the plurality of piezoelectric sensors, of the base; and the orthographic projection of each piezoelectric sensor on the base overlaps with the at least one of the plurality of holes.

13. The method according to claim 12, wherein the base further has a first surface and a second surface that are opposite to each other in the thickness direction of the base;
    forming the base having the at least one hole, includes:
    forming the at least one hole in the first surface by a dry etching process, a wet etching process, or a laser drilling process; and
    forming the at least one piezoelectric sensor on the base, includes:
    forming the at least one piezoelectric sensor on the second surface.

14. The method according to claim 12, wherein forming the heat conductive portion in the at least one hole, includes:
    forming the heat conductive portion in the at least one hole by an evaporation process or an electroplating process.

15. The method according to claim 12, wherein
    forming the at least one piezoelectric sensor on the base, includes:
    forming at least one first electrode on the base;
    forming a piezoelectric film on the at least one first electrode;
    forming at least one protective pattern made of a conductive material on the piezoelectric film; wherein an area of an orthographic projection of each protective pattern on the base is less than an area of an orthographic projection of the piezoelectric film on the base;

removing a portion of the piezoelectric film that is not covered by the at least one protective pattern by an etching process to form at least one piezoelectric pattern; and forming a conductive film on the at least one protective pattern; wherein each protective pattern and a portion of the conductive film that is in contact with the protective pattern forming a second electrode;

or forming the at least one piezoelectric sensor on the base, includes:

forming at least one first electrode on the base;

forming a piezoelectric film on the at least one first electrode;

forming at least one second electrode on the piezoelectric film; wherein an area of an orthographic projection of each second electrode on the base is less than an area of an orthographic projection of the piezoelectric film on the base; and removing a portion of the piezoelectric film that is not covered by the at least one second electrode by an etching process to form at least one piezoelectric pattern;

or forming the at least one piezoelectric sensor on the base, includes:

forming at least one first electrode on the base;

forming a piezoelectric film on the at least one first electrode;

forming at least one third photoresist pattern on the piezoelectric film; wherein an area of an orthographic projection of each third photoresist pattern on the base is less than an area of an orthographic projection of the piezoelectric film on the base;

removing a portion of the piezoelectric film that is not covered by the at least one third photoresist pattern by an etching process to form at least one piezoelectric pattern;

removing the at least one third photoresist pattern; and forming a second electrode on each piezoelectric pattern.

16. The method according to claim 15, wherein forming the at least one protective pattern on the piezoelectric film, includes:

forming a first conductive layer on the piezoelectric film;

forming a photoresist layer on the first conductive layer;

patterning the photoresist layer to form at least one first photoresist pattern; wherein an area of an orthographic projection of each first photoresist pattern on the base is less than an area of an orthographic projection of the piezoelectric film on the base; and etching a region in the first conductive layer that is not covered by the at least one first photoresist pattern to form the at least one protective pattern;

or forming the at least one second electrode on the piezoelectric film, includes:

forming a second conductive layer on the piezoelectric film;

forming a photoresist layer on the second conductive layer; wherein an area of an orthographic projection of each second photoresist pattern on the base is less than an area of an orthographic projection of the piezoelectric film on the base;

patterning the photoresist layer to form at least one second photoresist pattern; and etching a region in the second conductive layer that is not covered by the at least one second photoresist pattern to form the at least one second electrode.

17. A method for manufacturing a piezoelectric device, comprising:

forming at least one hole in a first surface of a base, a depth of the at least one hole being less than a thickness of the base;

forming a heat conductive portion in the at least one hole; wherein the heat conductive portion is in contact with a wall of the at least one hole, and a thermal conductivity of the heat conductive portion is greater than a thermal conductivity of the base;

forming at least one piezoelectric sensor on a second surface of the base opposite to the first surface; wherein each piezoelectric sensor includes a first electrode, a piezoelectric pattern made of a piezoelectric material and a second electrode that are sequentially formed on the base; and thinning the base to remove the at least one hole and the heat conductive portion therein, wherein the at least one hole includes a plurality of holes spaced apart from each other; the at least one piezoelectric sensor includes a plurality of piezoelectric sensors that are arranged in an array and spaced apart from each other; some holes of the plurality of holes are disposed in regions, facing the plurality of piezoelectric sensors, of the base, and remaining holes of the plurality of holes are disposed in regions, between the plurality of piezoelectric sensors, of the base; and an orthographic projection of each piezoelectric sensor on the base overlaps with at least one of the plurality of holes.

18. A piezoelectric device, obtained by using the method according to claim 17.

* * * * *